US011822107B2

(12) United States Patent
Koito et al.

(10) Patent No.: US 11,822,107 B2
(45) Date of Patent: Nov. 21, 2023

(54) LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Naoki Koito, Kanagawa (JP); Takashi Yonemoto, Kanagawa (JP); Tetsuro Otsuka, Kanagawa (JP); Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 150 days.

(21) Appl. No.: 17/338,142

(22) Filed: Jun. 3, 2021

(65) Prior Publication Data

US 2021/0302773 A1 Sep. 30, 2021

Related U.S. Application Data

(63) Continuation of application No. PCT/JP2019/048465, filed on Dec. 11, 2019.

(30) Foreign Application Priority Data

Dec. 14, 2018 (JP) ................................ 2018-234574

(51) Int. Cl.
| | |
|---|---|
| *G02B 5/22* | (2006.01) |
| *G02F 1/1333* | (2006.01) |
| *G02F 1/13363* | (2006.01) |
| *G02F 1/1337* | (2006.01) |
| *B32B 7/023* | (2019.01) |
| *B32B 27/18* | (2006.01) |
| *G02B 5/30* | (2006.01) |
| *G02F 1/1335* | (2006.01) |

(52) U.S. Cl.
CPC ............. *G02B 5/223* (2013.01); *B32B 7/023* (2019.01); *B32B 27/18* (2013.01); *G02B 5/3016* (2013.01); *G02F 1/13363* (2013.01); *G02F 1/133365* (2013.01); *G02F 1/133528* (2013.01); *G02F 1/133711* (2013.01); *C09K 2323/031* (2020.08)

(58) Field of Classification Search
CPC ......... G02F 1/133528; G02F 1/133533; G02F 1/133541; G02F 1/133365; C09K 2323/031; G02B 5/3016; B32B 7/023
See application file for complete search history.

(56) References Cited

U.S. PATENT DOCUMENTS

| | | | |
|---|---|---|---|
| 2010/0239788 A1 | 9/2010 | Hamasaki et al. | |
| 2015/0062505 A1 | 3/2015 | Hatanaka et al. | |
| 2017/0240810 A1* | 8/2017 | Hida | .................... G02B 5/3016 |
| 2019/0382586 A1 | 12/2019 | Katou et al. | |
| 2020/0018879 A1 | 1/2020 | Katou et al. | |
| 2020/0033663 A1 | 1/2020 | Hoshino et al. | |

FOREIGN PATENT DOCUMENTS

| | | | | |
|---|---|---|---|---|
| CN | 104345373 A | | 2/2015 | |
| CN | 113227850 B | * | 4/2023 | ............. G02B 5/223 |
| JP | 2010-244038 A | | 10/2010 | |
| JP | 2011-048311 A | | 3/2011 | |
| JP | 2011-178946 A | | 9/2011 | |
| JP | 2019-191507 A | | 10/2019 | |
| JP | 7314170 B2 | * | 7/2023 | ............. G02B 5/223 |
| WO | 2010/038818 A1 | | 4/2010 | |
| WO | 2018/164252 A1 | | 9/2018 | |
| WO | 2018/186503 A1 | | 10/2018 | |
| WO | 2018/199096 A1 | | 11/2018 | |

OTHER PUBLICATIONS

Office Action, issued by the State Intellectual Property Office dated Sep. 9, 2022, in connection with Chinese Patent Application No. 201980081762.X.
Office Action, issued by the Japanese Patent Office dated Jul. 5, 2022, in connection with Japanese Patent Application No. 2020-559281.
International Search Report issued in PCT/JP2019/048465 dated Feb. 4, 2020.
Written Opinion issued in PCT/JP2019/048465 dated Feb. 4, 2020.
International Preliminary Report on Patentability completed by WIPO dated Jun. 8, 2021 in connection with International Patent Application No. PCT/JP2019/048465.
Office Action, issued by the Japanese Patent Office dated Jan. 4, 2023, in connection with Japanese Patent Application No. 2020-559281.

\* cited by examiner

*Primary Examiner* — Sophie Hon
(74) *Attorney, Agent, or Firm* — EDWARDS NEILS LLC; Jean C. Edwards, Esq.

(57) ABSTRACT

The present invention provides a light absorption anisotropic film excellent in adhesiveness to an adjacent layer, and a laminate and an image display device, in which the light absorption anisotropic film is used. The light absorption anisotropic film is formed from a liquid crystal composition that contains a high-molecular weight liquid crystal compound and a dichroic substance, and is a light absorption anisotropic film in which regarding a signal derived from the dichroic substance detected by a time-of-flight secondary ion mass spectrometry, a relationship between a maximum intensity Imax in a thickness direction of a film and an intensity Isur on at least one surface of the film satisfies Expression (I-1) 2≤Imax/Isur.

19 Claims, No Drawings

LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2019/048465 filed on Dec. 11, 2019, which was published under PCT Article 21(2) in Japanese, and which claims priority under 35 U.S.C. § 119(a) to Japanese Patent Application No. 2018-234574 filed on Dec. 14, 2018. The above applications are hereby expressly incorporated by reference, in their entirety, into the present application.

BACKGROUND OF THE INVENTION

1. Field of the Invention

The present invention relates to a light absorption anisotropic film, a laminate, and an image display device.

2. Description of the Related Art

In the past, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing steps for each function.

For example, in an image display device (for example, a liquid crystal display device), a linear or circular polarizer is used to control optical activity or birefringence in the display. In addition, in organic light emitting diodes (OLEDs), a circular polarizer is used to prevent external light from being reflected.

In the related art, iodine has been widely used as a dichroic substance in these polarizers. However, a polarizer using an organic dye as a dichroic substance instead of iodine has also been examined.

For example, WO2018/199096A discloses a light absorption anisotropic film that is formed from a liquid crystal composition containing a linear high-molecular weight liquid crystal compound having a repeating unit; a low-molecular weight liquid crystal compound having a maximum absorption wavelength of 390 nm or less in a solution; and a dichroic substance ([claim 1] and [claim 5]).

SUMMARY OF THE INVENTION

As a result of examining the light absorption anisotropic film disclosed in WO2018/199096A, the inventors of the present invention revealed that the adhesiveness of the light absorption anisotropic film to a layer (for example, an alignment film) adjacent thereto may be inferior, depending on the types and the blending amounts of the dichroic substances.

An object of the present invention is to provide a light absorption anisotropic film excellent in adhesiveness to an adjacent layer, and a laminate and an image display device, in which the light absorption anisotropic film is used.

As a result of diligent studies to solve the above problems, the inventors of the present invention have found that in a case where an amount of a dichroic substance present in the vicinity of at least one surface of a light absorption anisotropic film is reduced, the adhesiveness to the adjacent layer is improved and have completed the present invention.

That is, the problems described above can be achieved by the following configurations.

[1] A light absorption anisotropic film formed from a liquid crystal composition that contains a high-molecular weight liquid crystal compound and a dichroic substance, in which regarding a signal derived from the dichroic substance detected by a time-of-flight secondary ion mass spectrometry, a relationship between a maximum intensity Imax in a thickness direction of a film and an intensity Isur on at least one surface of the film satisfies Expression (I-1), $$2 \leq I_{max}/I_{sur} \quad (I\text{-}1).$$

[2] The light absorption anisotropic film according to [1], in which the relationship between the maximum intensity Imax and the intensity Isur satisfies Expression (I-2), $$5 \leq I_{max}/I_{sur} \quad (I\text{-}2).$$

[3] The light absorption anisotropic film according to [1] or [2], in which the high-molecular weight liquid crystal compound has a polymerizable group.

[4] The light absorption anisotropic film according to any one of [1] to [3], in which the liquid crystal composition further contains a low-molecular weight liquid crystal compound.

[5] The light absorption anisotropic film according to [4], in which the low-molecular weight liquid crystal compound has a polymerizable group.

[6] The light absorption anisotropic film according to any one of [1] to [5], in which the liquid crystal composition further contains an interface improver.

[7] A laminate comprising, in the following order; a base material, an alignment film, and a light absorption anisotropic film, in which the light absorption anisotropic film is the light absorption anisotropic film according to any one of [1] to [6], and regarding a signal derived from the dichroic substance detected by a time-of-flight secondary ion mass spectrometry, a relationship between a maximum intensity Imax of the light absorption anisotropic film in a thickness direction and an intensity Isur on a surface of the light absorption anisotropic film, on a side where an alignment film is provided, satisfies Expression (I-1), $$2 \leq I_{max}/I_{sur} \quad (I\text{-}1).$$

[8] The laminate according to [7], further comprising a λ/4 plate which is provided on the light absorption anisotropic film.

[9] An image display device comprising the light absorption anisotropic film according to any one of [1] to [6] or the laminate according to [7] or [8].

According to the present invention, it is possible to provide a light absorption anisotropic film excellent in adhesiveness to an adjacent layer, and a laminate and an image display device, in which the light absorption anisotropic film is used.

DESCRIPTION OF THE PREFERRED EMBODIMENTS

In the following description, the present invention will be described in more detail.

The following description of constituent requirements is based on representative embodiments of the invention; however, the present invention is not limited thereto.

A numerical value range represented using "to" in the present specification means a range including the numerical values described before and after "to" as the lower limit and the upper limit respectively.

Further, in the present specification, as each component, a substance corresponding to each component may be used alone, or two or more kinds of substances may be used in a combination. Here, in a case where two or more kinds of substances are used in combination for each component, the content of the component refers to the total content of the substances used that is used in combination unless otherwise particularly specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Light Absorption Anisotropic Film]

The light absorption anisotropic film according to the embodiment of the present invention is a light absorption anisotropic film that is formed from a liquid crystal composition that contains a high-molecular weight liquid crystal compound and a dichroic substance.

Further, in the light absorption anisotropic film according to the embodiment of the present invention, regarding a signal derived from the dichroic substance detected by a time-of-flight secondary ion mass spectrometry (TOF-SIMS), a relationship between a maximum intensity Imax in a thickness direction of a film and an intensity Isur on at least one surface of the film satisfies Expression (I-1).

$$2 \leq I\text{max}/I\text{sur} \qquad (\text{I-1}).$$

<Measurement Method of TOF-SIMS>

The measurement by TOF-SIMS in the present invention is carried out as described below.

(1) Device and Conditions

Device: TRIFT V nanoTOF II (manufactured by Ulvac PHI Inc.)

Depth direction analysis: analyzed in combination with an Ar ion sputter

Measurement range: raster scanning of 256 points each in a direction and in orthogonal direction Polarity: positive or negative (2) Intensity Isur on Surface of Film In a case where a light absorption anisotropic film, which is a measurement target, is subjected to a mass spectrometric analysis measurement in a portion from each surface of the light absorption anisotropic film to 10% of the total thickness, among the average values (the average value of the intensity from the baseline) of the intensities of fragments derived from the dichroic substance, a lower value is defined as the intensity Isur.

(3) Maximum Intensity Imax in Thickness Direction of Film

In a case where a light absorption anisotropic film, which is a measurement target, is subjected to a mass spectrometric analysis measurement in a region to 80% of the total thickness, excluding the portion from each surface of the light absorption anisotropic film to 10% of the total thickness, the maximum value of the intensities (the intensity from the baseline) of fragments derived from the dichroic substance is defined as the maximum intensity Imax.

(4) About Measurement Target

In a case where a light absorption anisotropic film, which is a measurement target, is present as a laminate having an adjacent layer, the surface of the above-described light absorption anisotropic film (that is, the interface with the adjacent layer) can be identified as a point where the mass spectrometric intensity of the fragment derived from the high-molecular weight liquid crystal compound detected from the light absorption anisotropic film intersects with the mass spectrometric intensity of the fragment derived from the most abundant compound among the fragments detected from the adjacent layer.

In the present invention, as described above, in a case where the amount of the dichroic substance present in the vicinity of at least one surface of the light absorption anisotropic film is reduced, that is, in a case where regarding the signal derived from the dichroic substance detected by TOF-SIMS, the relationship between a maximum intensity Imax in the thickness direction of the film and the intensity Isur on at least one surface of the film satisfies Expression (I-1), the adhesiveness to the adjacent layer is improved.

Although the details of the reasons for the above have not been revealed; however, the inventors of the present invention presume that the reasons are as follows.

Regarding the reason for the inferior adhesiveness, the inventors of the present invention presume that the dichroic substance present in the vicinity of the surface of the light absorption anisotropic film easily adopts a crystal structure, and thus the toughness against peeling is lost.

Accordingly, in the present invention, it is presumed that by satisfying Expression (I-1), the amount of the dichroic substance present in the vicinity of at least one surface of the light absorption anisotropic film is reduced, the stress caused by the peeling is easily relaxed, and as a result, peeling hardly occurs even in a case where the same stress is applied as compared with the case where the dichroic substance is uniformly dispersed.

The present invention also includes an aspect in which the maximum intensity Imax is measured significantly but the intensity Isur is below the measurement limit, as is clear from the fact that Expression (I-1) does not specify the upper limit of the ratio (Imax/Isur) of the maximum intensity Imax to the intensity Isur.

Further, due to the reason that the adhesiveness to the adjacent layer is improved, it is preferable that the relationship between the maximum intensity Imax in the thickness direction of the light absorption anisotropic film and the intensity Isur on at least one surface of the light absorption anisotropic film satisfies Expression (I-2) and more preferably satisfies Expression (I-3).

$$5 \leq I\text{max}/I\text{sur} \qquad (\text{I-2}).$$

$$5 \leq I\text{max}/I\text{sur} \leq 100 \qquad (\text{I-3}).$$

[Liquid Crystal Composition]

Hereinafter, each of the components contained in the liquid crystal composition that is used for forming the light absorption anisotropic film according to the embodiment of the present invention will be described in detail.

<High-Molecular Weight Liquid Crystal Compound>

The "high-molecular weight liquid crystal compound" contained in the liquid crystal composition refers to a liquid crystal compound having a repeating unit in the chemical structure.

Examples of the high-molecular weight liquid crystal compound include the thermotropic high-molecular weight liquid crystalline molecule disclosed in JP2011-237513A and the high-molecular weight liquid crystal compounds described in paragraphs [0012] to [0042] of WO2018/199096A.

Due to the reason that the alignment degree of the obtained light absorption anisotropic film is higher, the high-molecular weight liquid crystal compound is preferably a high-molecular weight liquid crystal compound containing a repeating unit represented by Formula (1) (hereinafter, also abbreviated as a "repeating unit (1)").

In the following description, "the alignment degree of the obtained light absorption anisotropic film is higher" is also referred to as "the effects of the present invention are more excellent".

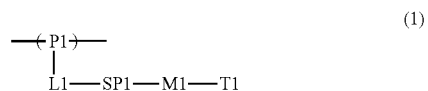

(1)

In Formula (1), P1 represents a main chain of the repeating unit, L1 represents a single bond or a divalent linking group, SP1 represents a single bond or a spacer group, M1 represents a mesogenic group, and T1 represents a terminal group.

Specific examples of the main chain of the repeating unit represented by P1 include groups represented by Formulae (P1-A) to (P1-D). Among these, a group represented by Formula (P1-A) is preferable from the viewpoint of the diversity of monomers as raw materials and ease of handling.

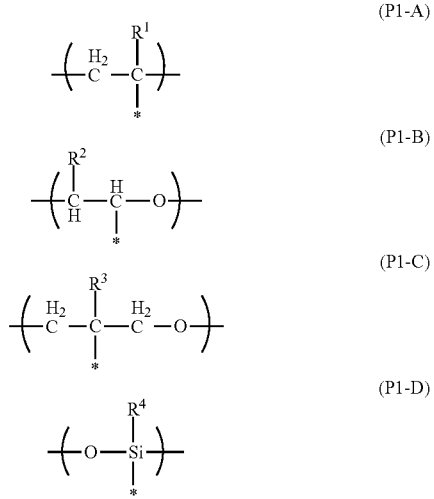

In Formulae (P1-A) to (P1-D), "*" represents a bonding position to L1 in Formula (1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or may be an alkyl group (a cycloalkyl group) having a cyclic structure. The alkyl group preferably has 1 to 5 carbon atoms.

The group represented by Formula (P1-A) is preferably an unit of a partial structure of a poly(meth)acrylic acid ester obtained by polymerizing a (meth)acrylic acid ester.

The group represented by Formula (P1-B) is preferably an ethylene glycol unit formed by subjecting an epoxy group of a compound having an epoxy group to ring-opening polymerization.

The group represented by Formula (P1-C) is preferably a propylene glycol unit formed by subjecting an oxetane group of a compound having an oxetane group to ring-opening polymerization.

The group represented by Formula (P1-D) is preferably a siloxane unit of a polysiloxane obtained by polycondensation of a compound having at least one of an alkoxysilyl group or a silanol group. Here, examples of the compound having at least one of an alkoxysilyl group or a silanol group include a compound having a group represented by Formula $SiR^{14}(OR^{15})_2$—. In the formula, $R^{14}$ is synonymous with $R^{14}$ in (P1-D), and a plurality of $R^{15}$'s each independently represent a hydrogen atom or an alkyl group having 1 to 10 carbon atoms.

In Formula (1), L1 is a single bond or a divalent linking group.

Examples of the divalent linking group represented by L1 include —C(O)O—, —OC(O)—, —O—, —S—, —C(O)NR³—, —NR³C(O)—, —S(O)₂—, and —NR³R⁴—. In the formula, $R^3$ and $R^4$ each independently represent a hydrogen atom or an alkyl group having 1 to 6 carbon atoms, which may have a substituent.

In a case where P1 is a group represented by Formula (P1-A), L1 is preferably a group represented by —C(O)O— due to the reason that the effects of the present invention are more excellent.

In a case where P1 is a group represented by Formulae (P1-B) to (P1-D), L1 is preferably a single bond due to the reason that the effects of the present invention are more excellent.

In Formula (1), the spacer group represented by SP1 preferably includes at least one group selected from the group consisting of an oxyethylene structure, an oxypropylene structure, a polysiloxane structure, and a fluorinated alkylene structure, due to the easy exhibition of liquid crystallinity, raw material availability, and the like.

Here, the oxyethylene structure represented by SP1 is preferably a group represented by *—(CH₂—CH₂O)$_{n1}$—*. In the formula, n1 represents an integer of 1 to 20, and * represents a bonding position to L1 or M1 in Formula (1). n1 is preferably an integer of 2 to 10, more preferably an integer of 2 to 4, and most preferably 3, due to the reason that the effects of the present invention are more excellent.

The oxypropylene structure represented by SP1 is preferably a group represented by *—(CH(CH₃)—CH₂O)$_{n2}$—* due to the reason that the effects of the present invention are more excellent. In the formula, n2 represents an integer of 1 to 3, and * represents a bonding position to L1 or M1.

The polysiloxane structure represented by SP1 is preferably a group represented by *—(Si(CH₃)₂—O)$_{n3}$—* due to the reason that the effects of the present invention are more excellent. In the formula, n3 represents an integer of 6 to 10, and * represents a bonding position to L1 or M1.

The fluorinated alkylene structure represented by SP1 is preferably a group represented by *—(CF₂—CF₂)$_{n4}$—* due to the reason that the effects of the present invention are more excellent. In the formula, n4 represents an integer of 6 to 10, and * represents a bonding position to L1 or M1.

In Formula (1), the mesogenic group represented by M1 is a group indicating the main skeleton of liquid crystalline molecules contributing to the formation of liquid crystal. The liquid crystalline molecule exhibits liquid crystallinity in an intermediate state (a mesophase) between a crystalline state and an isotropic liquid state. The mesogenic group is not particularly limited, and for example, the description on pages 7 to 16 of "Flussige Kristalle in Tabellen II" (VEB Deutsche Verlag fur Grundstoff Industrie, Leipzig, 1984) and the description in Chapter 3 of Liquid Crystal Handbook (Maruzen, 2000) edited by Liquid Crystal Handbook Editing Committee can be referred to.

The mesogenic group is preferably a group having at least one cyclic structure selected from the group consisting of an aromatic hydrocarbon group, a heterocyclic group, and an alicyclic group.

The mesogenic group preferably has an aromatic hydrocarbon group, more preferably 2 to 4 aromatic hydrocarbon groups, and still more preferably 3 aromatic hydrocarbon groups, due to the reason that the effects of the present invention are more excellent.

The mesogenic group is preferably a group represented by Formula (M1-A) or Formula (M1-B) and more preferably a group represented by Formula (M1-B), from the viewpoints of the exhibition of liquid crystallinity, the adjustment of the liquid crystal phase transition temperature, and the availability and the synthetic suitability of raw materials, and due to the fact that the effects of the present invention are more excellent.

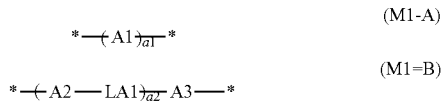

In Formula (M1-A), A1 is a divalent group selected from the group consisting of an aromatic hydrocarbon group, a heterocyclic group, and an alicyclic group. These groups may be substituted with an alkyl group, a fluorinated alkyl group, an alkoxy group, or a substituent.

The divalent group represented by A1 is preferably a 4- to 6-membered ring. The divalent group represented by A1 may be monocyclic or condensed.

* represents a bonding position to SP1 or T1.

Examples of the divalent aromatic hydrocarbon group represented by A1 include a phenylene group, a naphthylene group, a fluorene-diyl group, anthracene-diyl group, and a tetracene-diyl group, and from the viewpoint of the diversity of the design of a mesogenic skeleton and raw material availability, a phenylene group or a naphthylene group is preferable, and a phenylene group is more preferable.

The divalent heterocyclic group represented by A1 may be aromatic or non-aromatic; however, it is preferably a divalent aromatic heterocyclic group from the viewpoint of a further improvement in the alignment degree.

Examples of the atom other than the carbon atoms of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different from each other.

Specific examples of the divalent aromatic heterocyclic group include a pyridylene group (a pyridine-diyl group), a pyridazine-diyl group, an imidazole-diyl group, a thienylene (a thiophene-diyl group), a quinolylene group (a quinoline-diyl group), an isoquinolylene group (an isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same or different from each other.

In Formula (M1-B), A2 and A3 each independently represent a divalent group selected from the group consisting of an aromatic hydrocarbon group, a heterocyclic group, and an alicyclic group. Since specific examples and preferred aspects of A2 and A3 are the same as those of A1 of Formula (M1-A), the description thereof will be omitted.

In Formula (M1-B), a2 represents an integer of 1 to 10. In a case where a2 is 2 or more, a plurality of A2's may be the same or different from each other, a plurality of A3's may be the same or different each other, and a plurality of LA1's may be the same or different from each other. a2 is preferably an integer of 2 or more and more preferably 2 due to the reason that the effects of the present invention are more excellent.

In Formula (M1-B), in a case where a2 is 1, LA1 is a divalent linking group. In a case where a2 is 2 or more, a plurality of LA1's each independently represent a single bond or a divalent linking group, and at least one of the plurality of LA1's is a divalent linking group. In a case where a2 is 2, it is preferable that one of the two LA1s is a divalent linking group and the other is a single bond due to the reason that the effects of the present invention are more excellent.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Of them, —C(O)O— is preferable due to the reason that the effects of the present invention are more excellent. LA1 may be a group formed by combining two or more of the above groups.

Specific examples of M1 include the following structures. In the following specific examples, "Ac" represents an acetyl group.

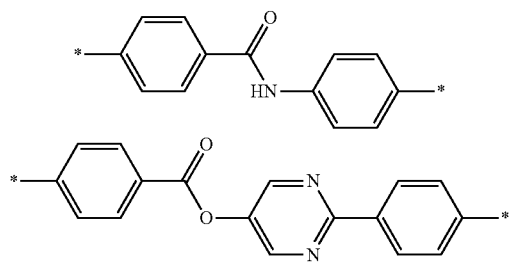

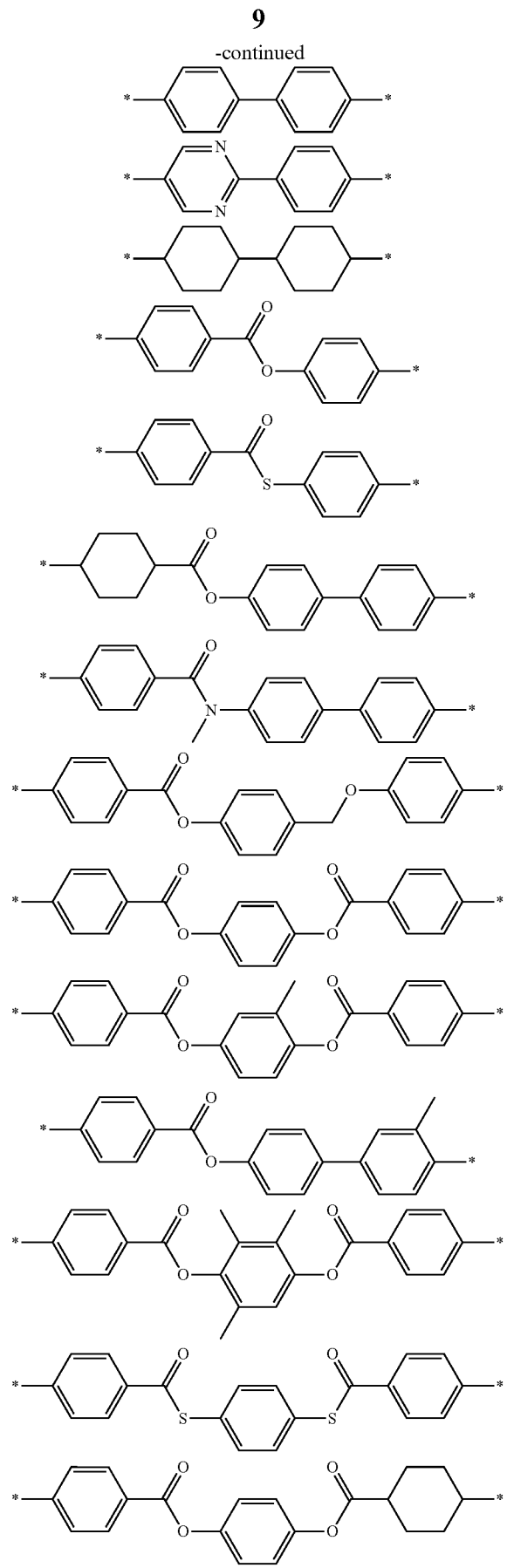
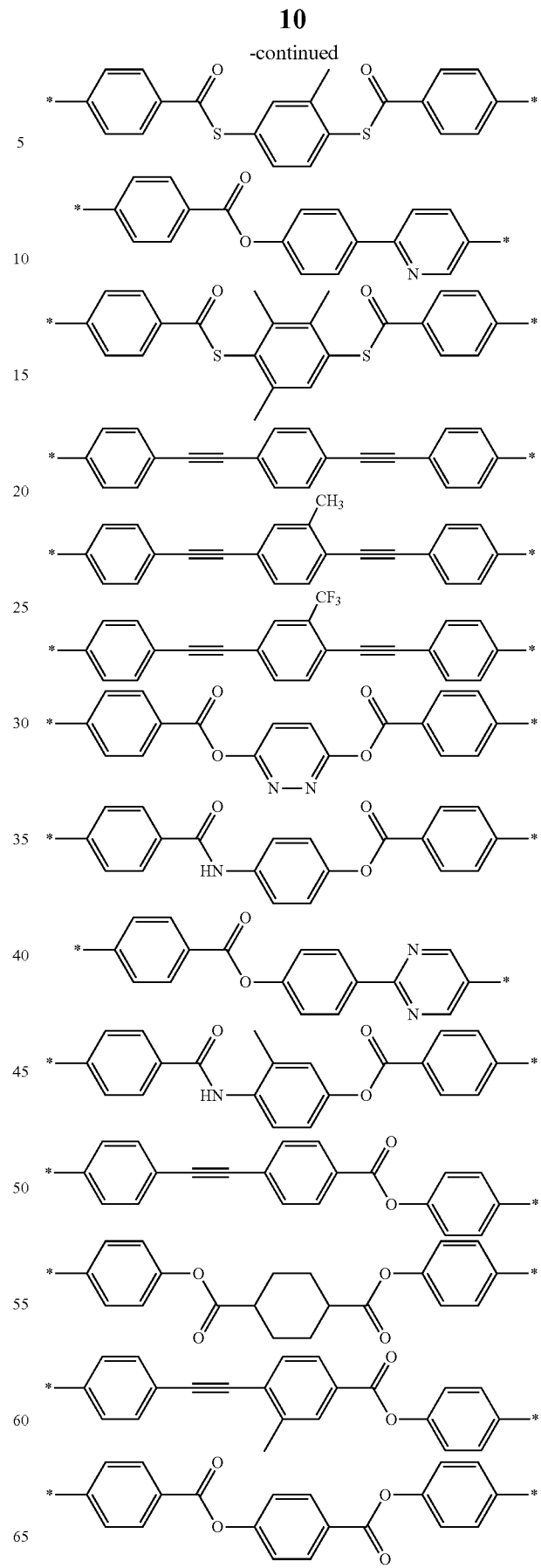

11
-continued
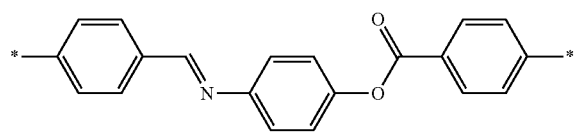
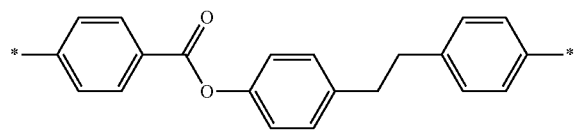
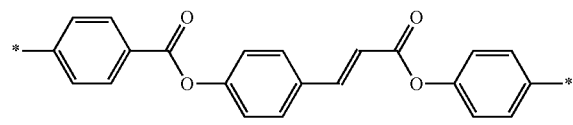
12
-continued
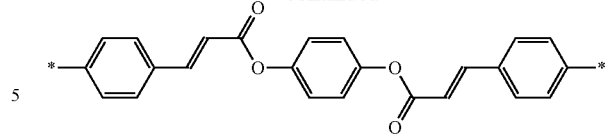
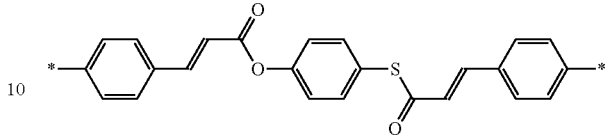
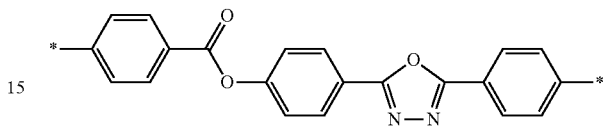
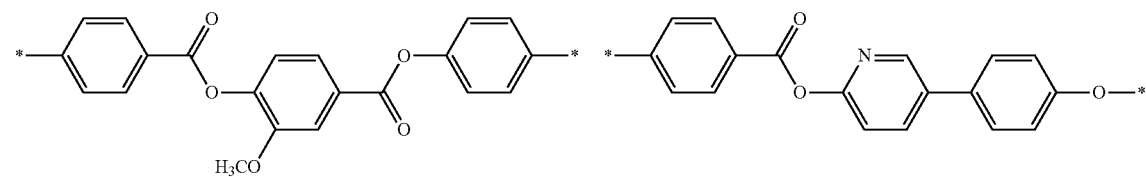
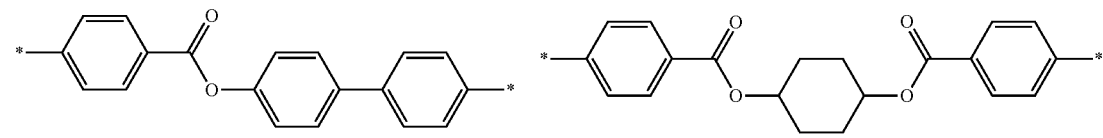
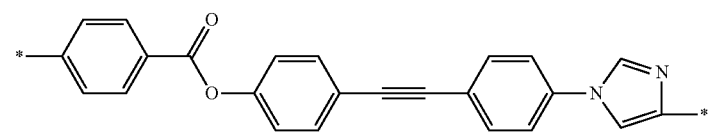
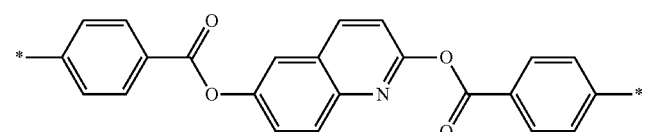
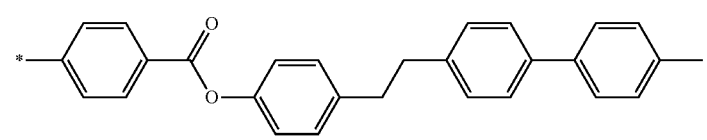
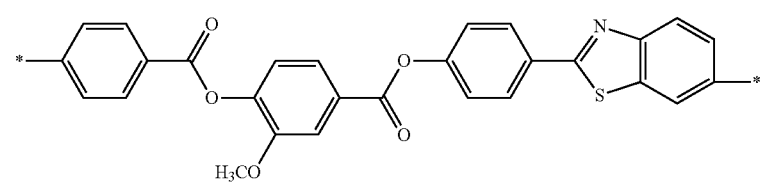
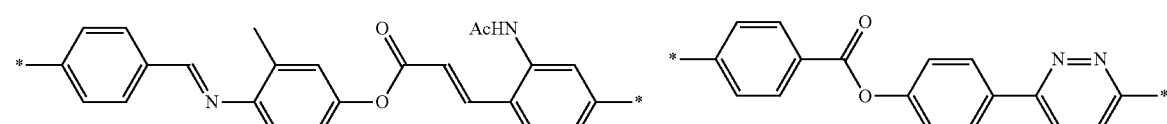
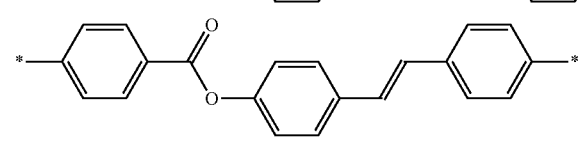

-continued
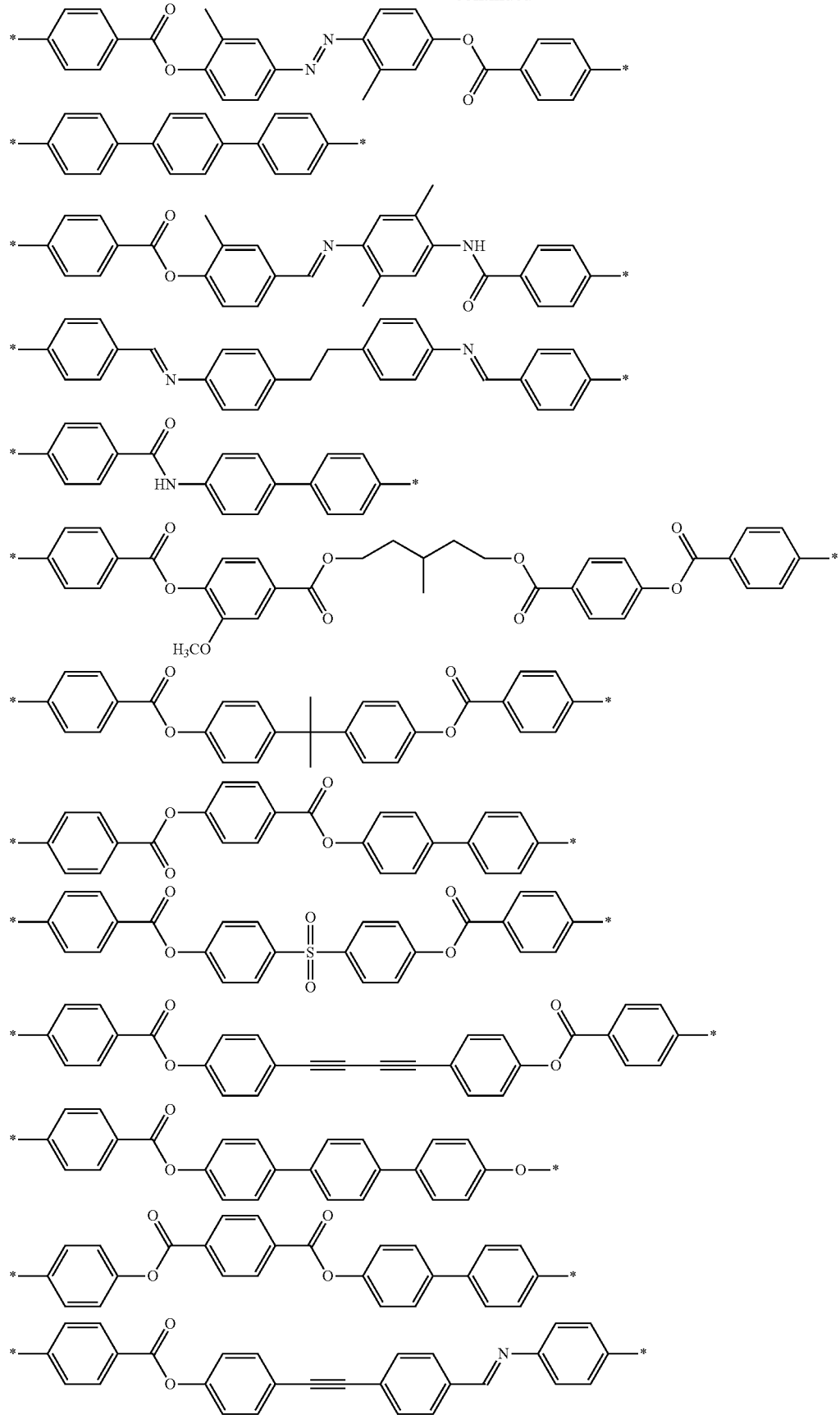

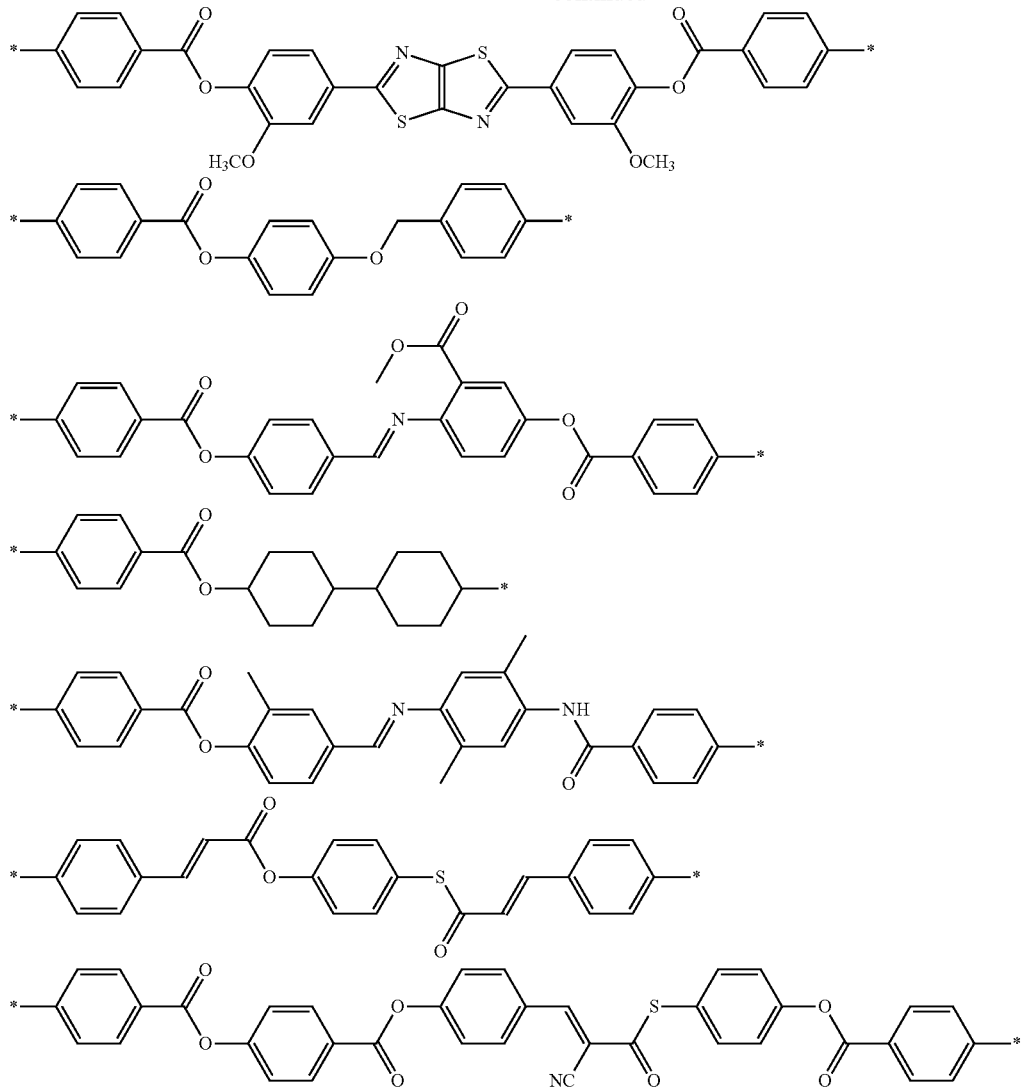

In Formula (1), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group (ROC(O)—: R is an alkyl group) having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, where specific examples of the linking group are the same as those of L1 and SP1 described above, and A represents an (meth) acryloyloxy group).

T1 is preferably an alkoxy group having 1 to 10 carbon atoms, more preferably an alkoxy group having 1 to 5 carbon atoms, and still more preferably a methoxy group, due to the reason that the effects of the present invention are more excellent.

These terminal groups may be further substituted with these groups or the polymerizable groups described in JP2010-244038A.

T1 is preferably a polymerizable group due to the reason that the adhesiveness to the adjacent layer can be improved and the cohesive force of the film can be improved.

The polymerizable group is not particularly limited; however, it is preferably a polymerizable group capable of undergoing the radical polymerization or the cationic polymerization.

As the radically polymerizable group, a generally known radically polymerizable group can be used, and suitable examples thereof include an acryloyl group and a methacryloyl group. In this case, it is known that the polymerization rate is fast generally in the case of acryloyl group, and thus the acryloyl group is preferable from the viewpoint of improving productivity; however, a methacryloyl group can also be used as the polymerizable group in the same manner.

As the cationically polymerizable group, a generally known cationically polymerizable group can be used, and specific examples thereof include an alicyclic ether group, a cyclic acetal group, a cyclic lactone group, a cyclic thioether group, a Spiro orthoester group, and a vinyloxy group. Among them, an alicyclic ether group or a vinyloxy group is preferable, and an epoxy group, an oxetanyl group, or a vinyloxy group is particularly preferable.

(Weight-Average Molecular Weight)

The weight-average molecular weight (Mw) of the high-molecular weight liquid crystal compound is preferably 1,000 to 500,000, and more preferably 2,000 to 300,000, due to the reason that the effects of the present invention are more excellent. In a case where Mw of the high-molecular weight liquid crystal compound is within the above range, the high-molecular weight liquid crystal compound is easily handled.

Particularly, from the viewpoint of suppressing cracking at the time of coating, the weight-average molecular weight (Mw) of the high-molecular weight liquid crystal compound is preferably 10,000 or more and more preferably 10,000 to 300,000.

From the viewpoint of the temperature latitude of the alignment degree, the weight-average molecular weight (Mw) of the high-molecular weight liquid crystal compound is preferably less than 10,000, and more preferably 2,000 to less than 10,000.

Here, in the present invention, the weight-average molecular weight and the number-average molecular weight are values measured by gel permeation chromatography (GPC).

Solvent (eluent): N-methylpyrrolidone
Device name: TOSOH HLC-8220GPC
Column: TOSOH TSK gel Super AWM-H (6 mm×15 cm) (three columns are connected and used)
Column temperature: 25° C.
Sample concentration: 0.1% by mass
Flow rate: 0.35 mL/min
Calibration curve: A calibration curve obtained using seven TSK standard polystyrene samples, manufactured by TOSOH Corporation, in a range of Mw=2,800,000 to 1,050 (Mw/Mn=1.03 to 1.06) is used.

(log P Value)

In the present invention, the log P value of the high-molecular weight liquid crystal compound is preferably 4.0 to 10, more preferably 4.3 to 9.5, and still more preferably 4.3 to 5.5, due to the reason that the compatibility with the dichroic substance, which will be described later, can be easily adjusted.

Here, the log P value is an index indicating the hydrophilic property and the hydrophobic property of a chemical structure and may be referred to as the hydrophilic-hydrophobic parameter. The log P value can be calculated using software such as ChemBioDraw Ultra or HSPiP (Ver. 4.1.07). In addition, the log P value can be obtained experimentally by the method in OECD Guidelines for the Testing of Chemicals, Sections 1, Test No. 117, or the like. In the present invention, the value calculated by inputting a structural formula of a compound to HSPiP (Ver. 4.1.07) is employed as a log P value unless otherwise particularly specified.

(Content)

In the present invention, the content of the high-molecular weight liquid crystal compound is such an amount that the content thereof is preferably 8% to 99% by mass and more preferably 8% to 96% by mass with respect to the solid content in the liquid crystal composition.

Here, the "solid content in the liquid crystal composition" refers to components excluding the solvent, and specific examples of the solid content include the above-described high-molecular weight liquid crystal compound, a dichroic substance, a polymerization initiator, and an interface improver, which will be described later.

<Dichroic Substance>

The dichroic substance contained in the liquid crystal composition is not particularly limited, and examples thereof include a visible light-absorbing substance (a dichroic dye), a luminescent substance (a fluorescent substance, a phosphorescent substance, or the like), an ultraviolet light-absorbing substance, an infrared light-absorbing substance, a nonlinear optical substance, a carbon nanotube, and an inorganic substance (for example, a quantum rod), and a conventionally known dichroic substance (a dichroic dye) can be used.

Specific examples of the dichroic substance include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252.

In the present invention, two or more kinds of dichroic substances may be used in combination. For example, from the viewpoint of making the color of the obtained light absorption anisotropic film close to black, at least one kind of dichroic substance having a maximum absorption wavelength in a wavelength range of 370 to 550 nm and at least one kind of dichroic substance having a maximum absorption wavelength in a wavelength range of 500 to 700 nm are preferably used in combination.

The dichroic substance may have a crosslinkable group.

Specific examples of the crosslinkable group include a (meth)acryloyl group, an epoxy group, an oxetanyl group, and a styryl group, and among these, a (meth)acryloyl group is preferable.

(Content)

The content of the dichroic substance is preferably 1 to 400 parts by mass, more preferably 2 to 100 parts by mass, and still more preferably 5 to 30 parts by mass, with respect to 100 parts by mass of the high-molecular weight liquid crystal compound from the viewpoint that the effects of the present invention are more excellent.

In addition, the content of the dichroic substance is such an amount that the content thereof is preferably 1% to 50% by mass and more preferably 2% to 40% by mass with respect to the solid content in the liquid crystal composition.

<Low-Molecular Weight Liquid Crystal Compound>

The liquid crystal composition preferably contains a low-molecular weight liquid crystal compound.

Here, the "low-molecular weight liquid crystal compound" refers to a liquid crystal compound having no repeating units in the chemical structure.

Examples of the low-molecular weight liquid crystal compound include the liquid crystal compounds disclosed in JP2013-228706A and the low-molecular weight liquid crystal compounds in paragraphs [0043] to [0050] of the WO2018/199096A.

In the present invention, the low-molecular weight liquid crystal compound preferably has a polymerizable group due to the reason that the adhesiveness to the adjacent layer can be improved and the cohesive force of the film can be improved.

Examples of the polymerizable group include those the same as the polymerizable groups which may be contained in the high-molecular weight liquid crystal compound described above.

(Molecular Weight)

The molecular weight of the low-molecular weight liquid crystal compound is preferably less than 1,700, more preferably 200 to 1,500, and still more preferably 200 or more and less than 1,000.

(Content)

In a case where the liquid crystal composition contains a low-molecular weight liquid crystal compound, the content of the low-molecular weight liquid crystal compound is preferably 1% to 90% by mass and more preferably 5% to 80% by mass with respect to the solid content in the liquid crystal composition.

In addition, in a case where the liquid crystal composition contains a low-molecular weight liquid crystal compound, the content of the low-molecular weight liquid crystal compound is preferably 3 to 300 parts by mass and more preferably 5 to 200 parts by mass with respect to the 100 parts by mass of the high-molecular weight liquid crystal compound.

<Polymerization Initiator>

The liquid crystal composition preferably contains a polymerization initiator.

The polymerization initiator is not particularly limited; however, a photosensitive compound, that is, a photopolymerization initiator is preferable.

As the photopolymerization initiator, various kinds of compounds can be used without particular limitations. Examples of the photopolymerization initiator include α-carbonyl compounds (the specifications of U.S. Pat. Nos. 2,367,661A and 2,367,670A), acyloin ethers (the specification of U.S. Pat. No. 2,448,828A), aromatic acyloin compounds substituted with α-hydrocarbon (the specification of U.S. Pat. No. 2,722,512A), polynuclear quinone compounds (the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), an o-acyloxime compound (paragraph [0065] in the specification of (JP2016-027384A)), and acylphosphine oxide compounds (JP1988-040799B (JP-S63-040799B), JP1993-029234B (JP-H5-029234B), JP1998-095788A (JP-H10-095788A), and JP1998-029997A (JP-H10-029997A)).

As such a photopolymerization initiator, a commercially available product can also be used, and examples thereof include IRGACURE-184, IRGACURE-907, IRGACURE-369, IRGACURE-651, IRGACURE-819, IRGACURE-OXE-01, and IRGACURE-OXE-02, which are manufactured by BASF SE.

In a case where the liquid crystal composition contains a polymerization initiator, the content of the polymerization initiator is preferably 0.01 to 30 parts by mass, and more preferably 0.1 to 15 parts by mass with respect to a total of 100 parts by mass of the dichroic substance and the high-molecular weight liquid crystal compound in the liquid crystal composition. In a case where the content of the polymerization initiator is 0.01 parts by mass or more, the durability of a light absorption anisotropic film is improved, and in a case where the content of the polymerization initiator is 30 parts by mass or less, the alignment degree of a light absorption anisotropic film is improved.

The polymerization initiator may be used alone, or two or more thereof may be used in combination. In a case where two or more kinds of polymerization initiators are contained, the total amount thereof is preferably within the above range.

<Interface Improver>

The liquid crystal composition preferably contains an interface improver.

Due to the interface improver contained, the smoothness of the coating surface is further improved, and the alignment degree is improved or cissing and unevenness are suppressed. Thus, the effect of improving the in-plane uniformity is expected.

As the interface improver, a material causing the dichroic substance and the high-molecular weight liquid crystal compound to be horizontal on the coating surface side is preferable, and, for example, the compounds described in paragraphs [0155] to [0170] of WO2016/009648A and the compounds (the horizontal alignment agents) described in paragraphs [0253] to [0293] of JP2011-237513A can be used.

In a case where the liquid crystal composition contains an interface improver, the content of the interface improver is preferably 0.001 to 5 parts by mass and more preferably 0.01 to 3 parts by mass with respect to a total of 100 parts by mass of the dichroic substance and the high-molecular weight liquid crystal compound in the liquid crystal composition.

The interface improver may be used alone, or two or more thereof may be used in combination. In a case where two or more kinds of interface improvers are contained, the total amount thereof is preferably within the above range.

<Solvent>

From the viewpoint of workability and the like, the liquid crystal composition according to the embodiment of the present invention preferably contains a solvent.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyltetrahydrofuran, cyclopentyl methyl ether, tetrahydropyran, and dioxolan), aliphatic hydrocarbons (for example, hexane), alicyclic hydrocarbons (for example, cyclohexane), aromatic hydrocarbons (for example, benzene, toluene, xylene, and trimethylbenzene), halocarbons (for example, dichloromethane, trichloromethane, dichloroethane, dichlorobenzene, and chlorotoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethyl sulfoxide), amides (for example, dimethylformamide, dimethylacetamide, N-methylpyrrolidone, and N-ethylpyrrolidone), and heterocyclic compounds (for example, pyridine), and water. These solvents may be used alone, or two or more thereof may be used in combination.

Among these solvents, ketones (particularly, cyclopentanone and cyclohexanone), ethers (particularly, tetrahydrofuran, cyclopentyl methyl ether, tetrahydropyran, and dioxolan), or amides (particularly, dimethylformamide, dimethylacetamide, N-methylpyrrolidone, and N-ethylpyrrolidone) are preferable from the viewpoint of utilizing the effect that the solubility of the liquid crystal composition is excellent.

In a case where the liquid crystal composition contains a solvent, the content of the solvent is preferably 80% to 99% by mass, more preferably 83% to 97% by mass, and particularly preferably 85% to 95% by mass with respect to the total mass of the liquid crystal composition.

The solvent may be used alone, or two or more thereof may be used in combination. In a case where two or more kinds of solvents are contained, the total amount thereof is preferably within the above range.

[Preparation Method]

The preparation method for the light absorption anisotropic film according to the embodiment of the present invention is not particularly limited as long as the abundance ratio of the dichroic substance can be adjusted so that Formula (I-1) is satisfied. Examples thereof include a method in which a step (hereinafter, also referred to as a "first coating film forming step") of coating an adjacent layer (for example, an alignment film) with a composition obtained by removing the above-described dichroic substance from the above-described liquid crystal composition, to form a first coating film, a step of coating the first coating film with the above-described liquid crystal composition to form a second coating film (hereinafter, also referred to as a "second coating film forming step"), and a step of aligning liquid crystalline components contained in the first coating film and the second coating film (hereinafter, also referred to as an "alignment step") in order.

The liquid crystalline component is a component that includes not only the above-described high-molecular weight liquid crystal compound and low-molecular weight liquid crystal compound but also the dichroic substance having liquid crystallinity in a case where the dichroic substance described above has liquid crystallinity.

<First Coating Film Forming Step>

The first coating film forming step is a step of coating an adjacent layer (for example, an alignment film) with a composition obtained by removing a dichroic substance from a liquid crystal composition, to form a first coating film.

Specific examples of the method of carrying out coating with a composition include known methods such as a roll coating method, a gravure printing method, a spin coating method, a wire bar coating method, an extrusion coating method, a direct gravure coating method, a reverse gravure coating method, a die coating method, a spray method, and an ink jet method.

<Second Coating Film Forming Step>

The second coating film forming step is a step of coating the first coating film with a liquid crystal composition to form a second coating film.

In a case where a liquid crystal composition containing the above-described solvent used or a liquid material such as a molten liquid obtained by heating the liquid crystal composition is used, the first coating film can be easily coated with the liquid crystal composition.

Examples of the method of carrying out coating with a liquid crystal composition include the same method as the method in the first coating film forming step.

<Alignment Step>

The alignment step is a step of aligning liquid crystalline components contained in the first coating film and the second coating film. Through this step, a light absorption anisotropic film satisfying Expression (I-1) described above can be obtained.

The alignment step may include a drying treatment. In a case where drying treatment is carried out, a component such as a solvent can be removed from the coating film. The drying treatment may be carried out by a method of leaving the coating film for a predetermined time at room temperature (for example, natural drying) or by a method of carrying out heating and/or air blowing.

Here, the liquid crystalline component contained in the liquid crystal composition may be aligned by the above-described coating film forming step or drying treatment. For example, in an aspect in which the liquid crystal composition is prepared as a coating liquid containing a solvent, the coating film is dried to remove the solvent from the coating film, whereby a coating film (that is, light absorption anisotropic film) having light absorption anisotropy is obtained.

In a case where the drying treatment is carried out at a temperature equal to or higher than the transition temperature of the liquid crystalline component contained in the coating film to the liquid crystal phase, the heating treatment which will be described later may not be carried out.

The transition temperature of the liquid crystalline component contained in the coating film to the liquid crystal phase is preferably 10° C. to 250° C. and more preferably 25° C. to 190° C. from the viewpoint of manufacturing suitability and the like. In a case where the transition temperature is 10° C. or higher, a cooling treatment or the like for lowering the temperature to a temperature range in which a liquid crystal phase is exhibited is not required, which is preferable. Further, in a case where the transition temperature is 250° C. or lower, a high temperature is not required even in a case of making the liquid crystalline component be in an isotropic liquid state in which the temperature is much higher than the temperature range in which once the liquid crystal phase is exhibited, which is preferable since deformation and alteration can be reduced.

The alignment step preferably has a heating treatment. Accordingly, the liquid crystalline component contained in the coating film can be aligned, and thus the coating film after the heating treatment can be preferably used as a light absorption anisotropic film.

The heating treatment is preferably carried out at 10° C. to 250° C. and more preferably at 25° C. to 190° C. in terms of manufacturing suitability or the like. The heating time is preferably 1 to 300 seconds and more preferably 1 to 60 seconds.

The alignment step may have a cooling treatment that is carried out after the heating treatment. The cooling treatment is a treatment for cooling the coating film after the heating to about 20° C. to 25° C. of room temperature. Accordingly, the alignment of the liquid crystalline component contained in the coating film can be fixed. The cooling means is not particularly limited, and the cooling can be carried out by a conventionally known method.

By the above steps, a light absorption anisotropic film can be obtained.

In the present aspect, examples of the method of aligning the liquid crystalline component contained in the coating film include the drying treatment and the heating treatment; however, the examples are not limited thereto, and a conventionally known alignment treatment can be used.

(Other Steps)

The method of manufacturing a light absorption anisotropic film may have a step of curing the light absorption anisotropic film (hereinafter, also referred to as a "curing step") after the alignment step.

The curing step is carried out, for example, by heating and/or light irradiation (exposure) in a case where the light absorption anisotropic film has a crosslinkable group (a polymerizable group). Among the above, light irradiation is preferably carried out to carrying out the curing step.

As the light source that is used for curing, various light sources such as infrared rays, visible light, and ultraviolet rays can be used, and ultraviolet rays are preferable. At the time of curing, ultraviolet rays may be applied while heating or may be applied through a filter that transmits only a specific wavelength.

In a case where the exposure is carried out while heating, the heating temperature at the time of exposure is preferably 25° C. to 140° C., although it depends on the transition temperature of the liquid crystalline component contained in the light absorption anisotropic film to the liquid crystal phase.

In addition, the exposure may be carried out under a nitrogen atmosphere. In a case where the light absorption anisotropic film is cured by radical polymerization, the inhibition of polymerization by oxygen is reduced, and thus the exposure is preferably carried out under a nitrogen atmosphere.

The thickness of the light absorption anisotropic film is not particularly limited; however, it is preferably 100 to 8,000 nm and more preferably 300 to 5,000 nm from the viewpoint of flexibility in a case where the laminate according to the embodiment of the present invention which will be described later is used for the polarizing element.

[Laminate]

The laminate according to the embodiment of the present invention include, in order, a base material, an alignment film, and a light absorption anisotropic film.

The light absorption anisotropic film included in the laminate according to the embodiment of the present invention is the above-described light absorption anisotropic film according to the embodiment of the present invention. In the light absorption anisotropic film, regarding a signal derived from the dichroic substance detected by TOF-SIMS, a relationship between a maximum intensity Imax of the light absorption anisotropic film in a thickness direction and an intensity Isur on a surface of the light absorption anisotropic film, on a side where an alignment film is provided, satisfies Expression (I-1).

$$2 \leq Imax/Isur \quad (I\text{-}1).$$

Hereinafter, the constituent layers of the laminate according to the embodiment of the present invention will be described.

[Base Material]

The base material included in the laminate according to the embodiment of the present invention can be selected depending on the usage of the light absorption anisotropic film, and examples thereof include glass and a polymer film. The light transmittance of the base material is preferably 80% or more.

In a case where a polymer film is used as the base material, an optically isotropic polymer film is preferably used. As specific examples and preferred aspects of the polymer, those described in paragraph [0013] of JP2002-022942A can be applied. In addition, even a conventionally known polymer such as polycarbonate or polysulfone in which birefringence is easily developed can also be used by reducing the developability through molecular modification described in WO2000/026705A.

[Alignment Film]

As the alignment film that is included in the laminate according to the embodiment of the present invention, any layer may be used as long as it allows the dichroic substance contained in the liquid crystal composition to have a desired alignment state on the alignment film.

Examples of the method of forming an alignment film include techniques such as a rubbing treatment on the film surface with an organic compound (preferably a polymer), oblique vapor deposition of an inorganic compound, forming a layer having microgrooves, and accumulation of an organic compound (for example, ω-tricosanoic acid, dioctadecylmethylammonium chloride, or methyl stearate) by the Langmure-Blogette method (LB film). Furthermore, there has been also known an alignment film having an aligning function that is imparted by applying an electrical field, applying a magnetic field, or by irradiation with light.

In the present invention, among the above, an alignment film formed by a rubbing treatment is preferable in terms of easy control of a pretilt angle of the alignment film, and an optical alignment film formed by irradiation with light is also preferable in terms of alignment uniformity.

<Rubbing Treated Alignment Film>

The polymer material used for an alignment film formed by a rubbing treatment is described in many documents, and many commercially available products are available. In the present invention, polyvinyl alcohol or polyimide, or a derivative thereof can be preferably used. Regarding the alignment film, the description in the 24th line on page 43 to the 8th line on page 49 in WO2001/088574A1 can be referred to. The thickness of the alignment film is preferably 0.01 to 10 μm and more preferably 0.01 to 2 μm.

<Optical Alignment Film>

As the optical alignment material that is used for an alignment film formed by irradiation with light is described in many documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignable units described in JP2002-265541A and JP2002-317013A, photo-crosslinkable silane derivatives described in JP4205195B and JP4205198B, and photo-crosslinkable polyimides, polyamides, and esters described in JP2003-520878A, JP2004-529220A, and JP4162850B. Azo compounds, photo-crosslinkable polyimides, polyamides, or esters are more preferable.

Among these, as the optical alignment material, it is preferable to use a photosensitive compound having a photoreactive group in which at least one of dimerization or isomerization is generated by the action of light.

Examples of the photoreactive group include a group having a cinnamic acid (cinnamoyl) structure (skeleton), a group having a coumarin structure (skeleton), a group having a chalcone structure (skeleton), a group having a benzophenone structure (skeleton), and a group having anthracene structure (skeleton). Among these groups, a group having a cinnamoyl structure or a group having a coumarin structure is preferable, and a group having a cinnamoyl structure is more preferable.

Further, the photosensitive compound having the photoalignable group may further have a crosslinkable group.

The crosslinkable group is preferably a thermally crosslinkable group that undergoes a curing reaction by the action of heat or a photo-crosslinkable group that undergoes a curing reaction by the action of light and may be a crosslinkable group having both a thermally crosslinkable group and a photo-crosslinkable group.

Examples of the crosslinkable group include at least one selected from the group consisting of an epoxy group, an oxetanyl group, a group represented by —NH—$CH_2$—O—R (R represents a hydrogen atom or an alkyl group having 1 to 20 carbon atoms), a group having an ethylenically unsaturated double bond, and a blocked isocyanate group. Among these, a group having an epoxy group, an oxetanyl group, or an ethylenically unsaturated double bond is preferable.

It is noted that a 3-membered cyclic ether group is also called an epoxy group, and a 4-membered cyclic ether group is also called an oxetanyl group.

Specific examples of the group having an ethylenically unsaturated double bond include a vinyl group, an allyl group, a styryl group, an acryloyl group, and a methacryloyl group, and preferred examples thereof are an acryloyl group and a methacryloyl group.

To an optical alignment film formed from the above-described material, linearly polarized light or non-polarized light is applied to manufacture an optical alignment film.

In this specification, the "linearly polarized light irradiation" and the "non-polarized light irradiation" are operations for causing a photoreaction to the optical alignment material. The wavelength of the light used varies depending on the optical alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and a YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or diagonal from the alignment film surface is employed. Although the incidence angle of the light varies depending on the optical alignment material, the incidence angle is preferably 0° to 90° (vertical) and more preferably 40° to 90°.

In a case where non-polarized light is used, the alignment film is irradiated with non-polarized light from a diagonal direction. The incidence angle of the light is preferably 10° to 80°, more preferably 20° to 60°, and still more preferably 30° to 50°.

The irradiation time is preferably 1 minute to 60 minutes and more preferably 1 minute to 10 minutes.

In a case where patterning is required, a method of carrying out light irradiation using a photomask as many times as necessary for pattern formation, or a pattern writing method using laser beam scanning can be employed.

[Light Absorption Anisotropic Film]

Since the light absorption anisotropic film included in the laminate according to the embodiment of the present invention is as described above, the description thereof will be omitted.

[λ/4 Plate]

The laminate according to the embodiment of the invention preferably has a λ/4 plate that is formed on the light absorption anisotropic film.

Here, the "λ/4 plate" is a plate having a λ/4 function, and is specifically, a plate having a function of converting linearly polarized light having a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In another aspect in which the λ/4 plate has a multilayered structure, specific examples of the plate include a broadband λ/4 plate obtained by laminating a λ/4 plate and a λ/2 plate.

The λ/4 plate and the light absorption anisotropic film may be provided to be in contact with each other, or another layer may be provided between the λ/4 plate and the light absorption anisotropic film. Examples of the layer include a pressure-sensitive adhesive layer and an adhesive layer for securing adhesiveness.

[Barrier Layer]

The laminate according to the embodiment of the present invention preferably has a barrier layer on the light absorption anisotropic film (the λ/4 plate in a case of having the above-described λ/4 plate).

Here, the barrier layer is also called a gas barrier layer (an oxygen barrier layer) and has the function of protecting the polarizing element of the present invention from a gas such as oxygen in the atmosphere, moisture, or a compound contained in the adjacent layer.

Regarding the barrier layer, the descriptions in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Pressure-Sensitive Adhesive Layer]

The laminate according to the embodiment of the present invention may have a pressure-sensitive adhesive layer on the surface to which the λ/4 plate is bonded from the viewpoint of bonding the above-described λ/4 plate.

Examples of the pressure-sensitive adhesive contained in the pressure-sensitive adhesive layer include a rubber-based pressure-sensitive adhesive, an acrylic pressure-sensitive adhesive, a silicone-based pressure-sensitive adhesive, a urethane-based pressure-sensitive adhesive, a vinyl alkyl ether-based pressure-sensitive adhesive, a polyvinyl alcohol-based pressure-sensitive adhesive, a polyvinyl pyrrolidone-based pressure-sensitive adhesive, a polyacrylamide-based pressure-sensitive adhesive, and a cellulose-based pressure-sensitive adhesive.

Among these, an acrylic pressure-sensitive adhesive (a pressure-sensitized adhesive) is preferable from the viewpoint of transparency, weather resistance, heat resistance, and the like.

The pressure-sensitive adhesive layer can be formed, for example, by a method in which a release sheet is coated with a solution of a pressure-sensitive adhesive, dried, and then transferred onto a surface of a transparent resin layer; and a method in which a surface of a transparent resin layer is directly coated with a solution of a pressure-sensitive adhesive and then dried.

A solution of a pressures sensitive adhesive is prepared as a solution in which about 10% to 40% by mass of a pressure-sensitive adhesive is dissolved or dispersed in a solvent such as toluene or ethyl acetate.

As the coating method, a roll coating method such as reverse coating or gravure coating, a spin coating method, a screen coating method, a fountain coating method, a dipping method, a spray method, or the like can be adopted.

Examples of the constituent material of the release sheet include foliate bodies such as a synthetic resin film such as polyethylene, polypropylene, or polyethylene terephthalate; a rubber sheet; paper; fabric; non-woven fabric; a net; a foam sheet; and a metal foil.

In the present invention, the thickness of any pressure-sensitive adhesive layer is not particularly limited; however, it is preferably 3 µm to 50 µm, more preferably 4 µm to 40 µm, and still more preferably 5 µm to 30 µm.

[Usage]

The laminate according to the embodiment of the present invention can be used as a polarizing element (a polarizing plate), and for example, can be used as a linearly polarizing plate or a circularly polarizing plate.

In a case where the laminate according to the embodiment of the invention has no optically anisotropic layer such as the λ/4 plate, the laminate can be used as a linearly polarizing plate.

In a case where the laminate according to the embodiment of the invention has the λ/4 plate, the laminate can be used as a circularly polarizing plate.

[Image Display Device]

The image display device according to the embodiment of the present invention has the above-described laminate according to the embodiment of the present invention.

The display element used for the image display device according to the embodiment of the invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the invention, a liquid crystal display device using a liquid crystal cell as a display element, or an organic EL display device using an organic EL display panel as a display element is preferable, and a liquid crystal display device is more preferable.

[Liquid Crystal Display Device]

The liquid crystal display device which is one example of the image display device according to the embodiment of the present invention is a liquid crystal display device having the above-described laminate according to the embodiment of the present invention (however, the λ/4 plate is not included) and a liquid crystal cell.

In the present invention, the laminate according to the embodiment of the present invention is preferably used as a polarizing element on the front side among laminates that are provided on both sides of a liquid crystal cell, and the laminate according to the embodiment of the present invention is more preferably used as a polarizing element on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode; however, the liquid crystal cell is not limited thereto.

In a TN mode liquid crystal cell, without the application of a voltage, rod-like liquid crystalline molecules (rod-like liquid crystal compounds) are substantially horizontally aligned, and further, twist-aligned by 60° to 120°. The TN mode liquid crystal cell is most frequently used as a color TFT liquid crystal display device and is described in many documents.

In a VA mode liquid crystal cell, rod-like liquid crystalline molecules are substantially vertically aligned without application of a voltage. The VA mode liquid crystal cell includes (1) a narrowly-defined VA mode liquid crystal cell in which rod-like liquid crystalline molecules are substantially vertically aligned without application of a voltage, and are substantially horizontally aligned with the application of a voltage (described in JP1990-176625A (JP-H2-176625A)), (2) a (multi-domain vertical alignment (MVA) mode) liquid crystal cell in which the VA mode is made into multi-domains in order to expand the viewing angle (described in SID97, Digest of tech. Papers (proceedings) 28 (1997) 845), (3) an (n-type axially symmetric aligned microcell (n-ASM) mode) liquid crystal cell in which rod-like liquid crystalline molecules are substantially vertically aligned without application of a voltage, and are twisted and aligned in multi-domains with the application of a voltage (described in the proceedings 58 and 59 of Japanese Liquid Crystal Conference (1998)), and (4) a SURVIVAL mode liquid crystal cell (announced at Liquid Crystal Display (LCD) International 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. Methods of improving the viewing angle by reducing light leakage caused when a black image is displayed in a diagonal direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the embodiment of the present invention preferably has an aspect in which the above-described laminate according to the embodiment of the present invention (however, a pressure-sensitive adhesive layer and a λ/4 plate are included) and an organic EL display panel are included in order from the visual recognition side. In this case, in the laminate, a transparent support, an alignment film that is provided as necessary, a light absorption anisotropic film, a transparent resin layer, a pressure-sensitive adhesive layer, and a λ/4 plate disposed in order from the visual recognition side.

In addition, the organic EL display panel is a display panel having a configuration using an organic EL element in which an organic light emitting layer (organic electroluminescence layer) is interposed between electrodes (between a cathode and an anode). The configuration of the organic EL display panel is not particularly limited, and a conventionally known configuration is employed.

EXAMPLES

Hereinafter, the present invention will be described in more detail based on Examples. Materials, used amounts, ratios, treatment contents, treatment procedures, and the like shown in the following examples are able to be properly changed without departing from the gist of the invention. Therefore, the scope of the present invention should not be restrictively interpreted by the following Examples.

Example 1

<Preparation of Alignment Film-Attached Base Material>

A TAC film TJ40UL (thickness: 40 μm, manufactured by FUJIFILM Corporation) was continuously coated, using a wire bar, with a coating liquid 1 for forming an alignment film, which will be described later.

The support on which the coating film was formed was dried with warm air at 140° C. for 120 seconds, and then the coating film was irradiated with polarized ultraviolet rays (10 mJ/cm², using an ultra high-pressure mercury lamp) to obtain an optical alignment film PA1, whereby an optical alignment film-attached TAC film was obtained.

The film thickness of the optical alignment film PA1 was 1.0 μm.

| Composition of coating liquid PA1 for forming alignment film | |
|---|---|
| Polymer PA-1 below | 100.00 parts by mass |
| Acid generator TAG-1 below | 5.00 parts by mass |
| Acid generator CPI-110TF below | 0.005 parts by mass |
| Butyl acetate | 1073.60 parts by mass |
| Methyl isobutyl ketone | 268.40 parts by mass |

Polymer PA-1

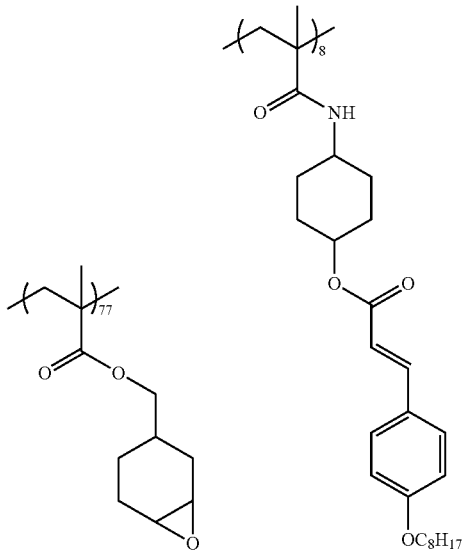

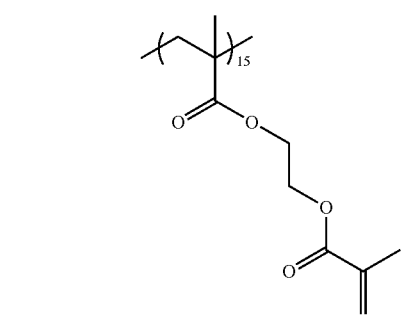

Acid Generator TAG-1

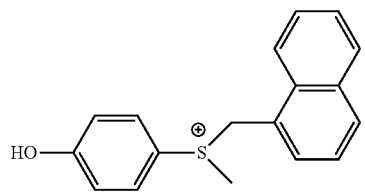

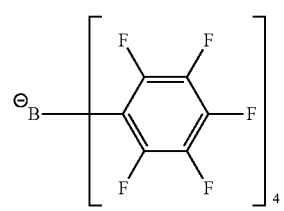

Acid Generator CPI-110F

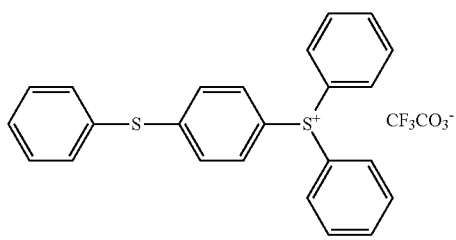

<Formation of Light Absorption Anisotropic Film P1>

The obtained optical alignment film PA1 was continuously coated with the following liquid crystal composition P1 using a wire bar to form a coating layer P1.

Next, the coating layer P1 was heated at 140° C. for 90 seconds, and the coating layer P1 was cooled to 23° C. of room temperature.

Next, the coating layer P1 was heated at 100° C. for 60 seconds and cooled again to room temperature.

Then, a light absorption anisotropic film P1 was prepared on the alignment film PA1 by irradiating with an LED lamp (center wavelength: 365 nm) for 2 seconds under an irradiation condition of an illuminance of 200 mW/cm².

The film thickness of the light absorption anisotropic film P1 was 0.4 μm.

| Composition of liquid crystal composition P1 | |
|---|---|
| Azo dye Y-1 below | 0.25 parts by mass |
| Azo dye M-1 below | 0.27 parts by mass |
| Azo dye C-1 below | 0.65 parts by mass |
| High-molecular weight liquid crystal compound P-1 below | 3.59 parts by mass |
| Polymerization initiator | |
| IRGACURE OXE-02 (manufactured by BASF SE) | 0.200 parts by mass |
| Interface improver F-1 below | 0.013 parts by mass |
| Cyclopentanone | 47.50 parts by mass |
| Tetrahydrofuran | 47.50 parts by mass |

Azo Dye Y-1

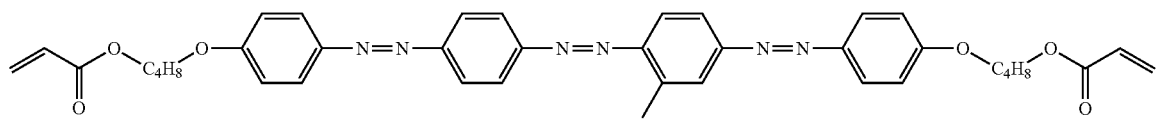

Azo Dye M-1

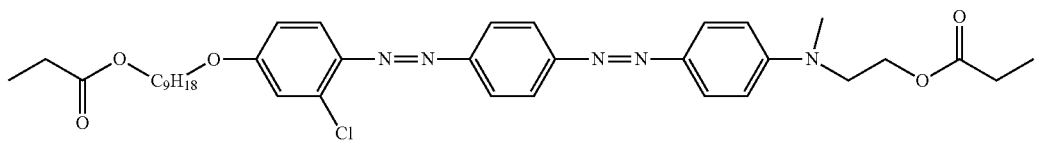

Azo Dye C-1

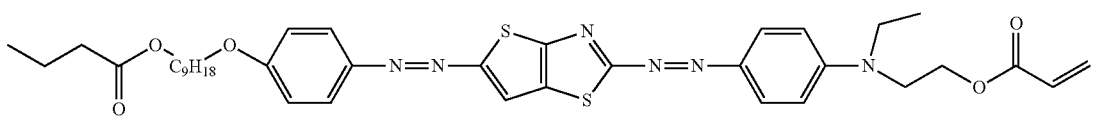

Synthesis of High-Molecular Weight Liquid Crystal Compound P-1

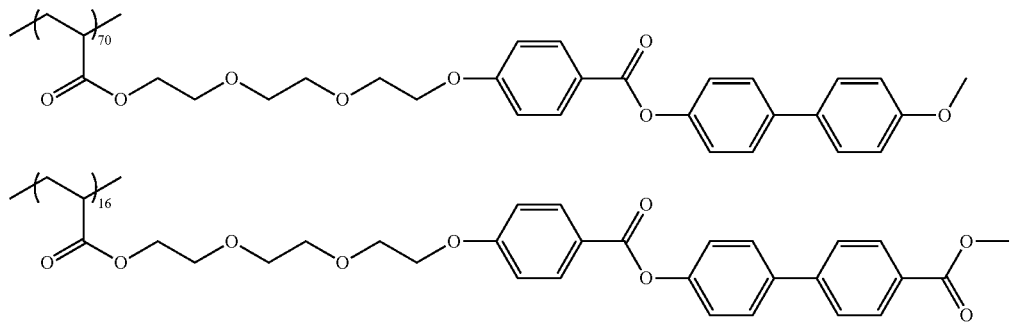

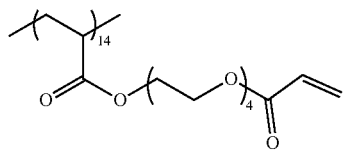

Interface Improver F-1

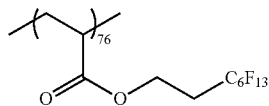

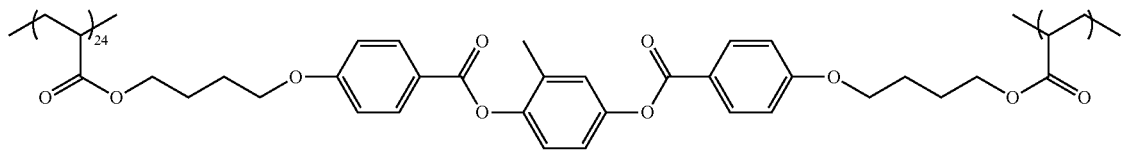

<Formation of Oxygen Barrier Layer B1>

The light absorption anisotropic film P1 was continuously coated with a coating liquid having the following composition with a wire bar. Then, the coated light absorption anisotropic film P1 was dried with warm air at 90° C. for 2 minutes to prepare a laminated film 1 having a polyvinyl alcohol (PVA) layer having a thickness of 1.5 μm, which was formed on the light absorption anisotropic film P1.

| Composition of composition B1 for forming an oxygen barrier layer | |
|---|---|
| Modified polyvinyl alcohol below Polymerization initiator | 3.80 parts by mass |
| IRGACURE 2959 (manufactured by BASF SE) | 0.20 parts by mass |
| Water | 70 parts by mass |
| Methanol | 30 parts by mass |

Modified Polyvinyl Alcohol

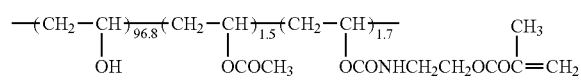

Example 2

<Formation of Light Absorption Anisotropic Film P2>

The obtained alignment film PA1 was coated with a liquid crystal composition P2 having the following composition using a wire bar to form a coating layer P2.

Next, the coating layer P2 was heated at 140° C. for 90 seconds, and the coating layer P2 was cooled to 23° C. of room temperature.

Next, the coating layer P2 was heated at 90° C. for 60 seconds and cooled again to room temperature.

Then, a light absorption anisotropic film P2 was prepared on the alignment film PA1 by irradiating with an LED lamp (center wavelength: 365 nm) for 2 seconds under an irradiation condition of an illuminance of 200 mW/cm$^2$.

The film thickness of the light absorption anisotropic film P2 was 0.4 μm.

| Composition of liquid crystal composition P2 | |
|---|---|
| Azo dye Y-1 above | 0.25 parts by mass |
| Azo dye M-1 above | 0.27 parts by mass |
| Azo dye C-1 above | 0.65 parts by mass |
| High-molecular weight liquid crystal compound P-1 above | 3.23 parts by mass |
| Low-molecular weight liquid crystal compound L-1 below Polymerization initiator | 0.36 parts by mass |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

Low-Molecular Weight Liquid Crystal Compound L-1

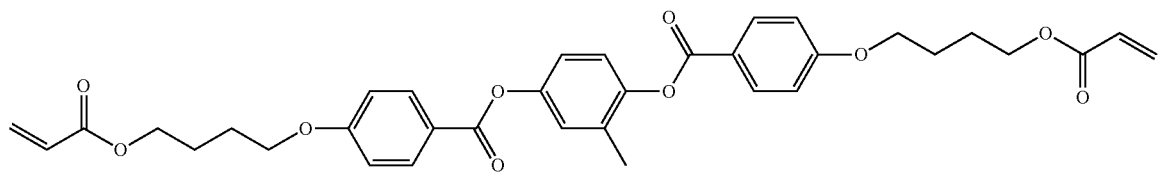 [SMILES: C=CC(=O)OCCCCOc1ccc(C(=O)Oc2ccc(OC(=O)c3ccc(OCCCCOC(=O)C=C)cc3)c(C)c2)cc1]

An oxygen barrier layer B1 was formed on the obtained light absorption anisotropic layer P2 in the same manner as in Example 1 to prepare a laminated film 2.

Examples 3 to 8

Laminated film s 3 to 8 of Examples 3 to 8 were prepared in the same manner as in Example 2, except that the liquid crystal composition P2 in the formation of the light absorption anisotropic film P2 of Example 2 was changed to the liquid crystal compositions P3 to P8 as shown below. The film thickness of the light absorption anisotropic film was 0.4

| Composition of liquid crystal composition P3 | |
|---|---|
| Azo dye Y-1 above | 0.25 parts by mass |
| Azo dye M-1 above | 0.27 parts by mass |
| Azo dye C-1 above | 0.65 parts by mass |
| High-molecular weight liquid crystal compound P-1 above | 3.23 parts by mass |
| Low-molecular weight liquid crystal compound L2 below | 0.36 parts by mass |
| Polymerization initiator | |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

Low-Molecular Weight Liquid Crystal Compound L-2

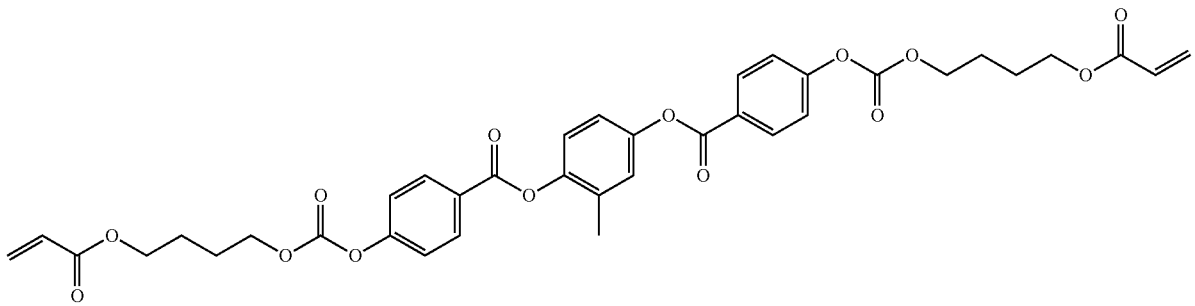 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

| Composition of liquid crystal composition P4 | |
|---|---|
| Azo dye Y-1 above | 0.25 parts by mass |
| Azo dye M-1 above | 0.27 parts by mass |
| Azo dye C-1 above | 0.65 parts by mass |
| High-molecular weight liquid crystal compound P-2 below | 3.23 parts by mass |
| Low-molecular weight liquid crystal compound L-2 above | 0.36 parts by mass |
| Polymerization initiator | |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

Synthesis of High-Molecular Weight Liquid Crystal Compound P-2

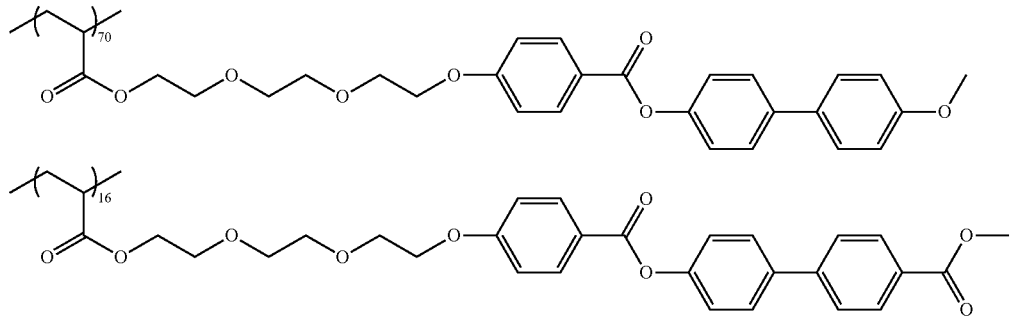

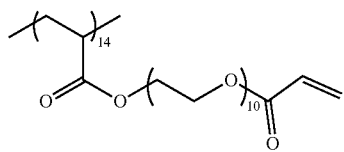

| Composition of liquid crystal composition P5 | |
|---|---|
| Azo dye Y-1 above | 0.25 parts by mass |
| Azo dye M-1 above | 0.27 parts by mass |
| Azo dye C-2 below | 0.65 parts by mass |
| High-molecular weight liquid crystal compound P-2 above | 3.23 parts by mass |
| Low-molecular weight liquid crystal compound L-2 above | 0.36 parts by mass |
| Polymerization initiator | |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

Azo Dye C-2

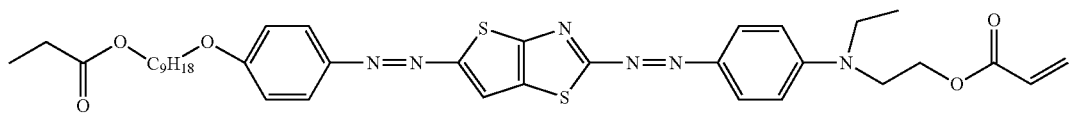

| Composition of liquid crystal composition P6 | |
|---|---|
| Azo dye Y-1 above | 0.25 parts by mass |
| Azo dye M-1 above | 0.27 parts by mass |
| Azo dye C-2 above | 0.65 parts by mass |
| High-molecular weight liquid crystal compound P-2 above | 3.23 parts by mass |
| Low-molecular weight liquid crystal compound L-3 below | 0.36 parts by mass |
| Polymerization initiator | |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

Low-Molecular Weight Liquid Crystal Compound L-3

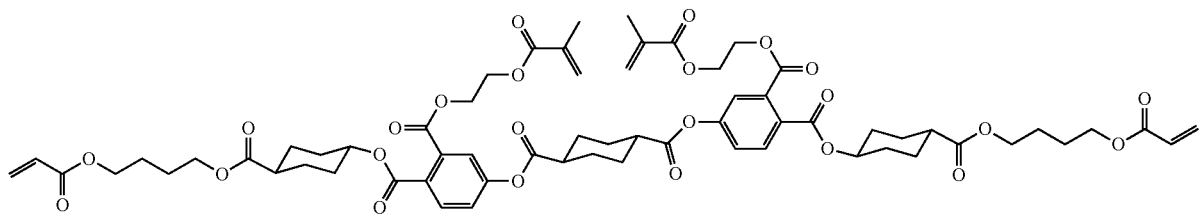 [SMILES: C=CC(=O)OCCCCOC(=O)C1CCC(OC(=O)c2ccc(OC(=O)C3CCC(C(=O)Oc4ccc(C(=O)OC5CCC(C(=O)OCCCCOC(=O)C=C)CC5)c(C(=O)OCCOC(=O)C(=C)C)c4)CC3)cc2C(=O)OCCOC(=O)C(=C)C)CC1]

| Composition of liquid crystal composition P7 | |
|---|---|
| Azo dye Y-1 above | 0.25 parts by mass |
| Azo dye M-1 above | 0.27 parts by mass |
| Azo dye C-1 above | 0.65 parts by mass |
| High-molecular weight liquid crystal compound P-3 below | 3.23 parts by mass |
| Low-molecular weight liquid crystal compound L-2 above | 0.36 parts by mass |
| Polymerization initiator | |
| IRGACURE OXE-02 (manufactured by BASF SE) | 0.200 parts by mass |
| Interface improver F-1 above | 0.013 parts by mass |
| Cyclopentanone | 47.50 parts by mass |
| Tetrahydrofuran | 47.50 parts by mass |

High-Molecular Weight Liquid Crystal Compound P-3

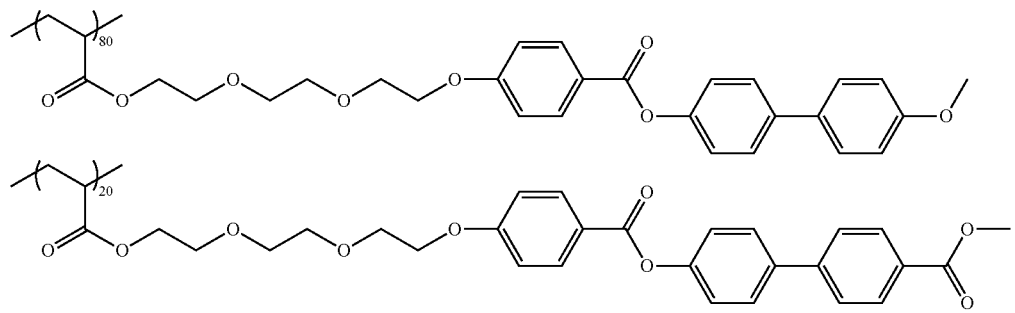

| Composition of liquid crystal composition P8 | |
|---|---|
| Azo dye Y-1 above | 0.25 parts by mass |
| Azo dye M-1 above | 0.27 parts by mass |
| Azo dye C-1 above | 0.65 parts by mass |
| High-molecular weight liquid crystal compound P-1 above | 3.59 parts by mass |
| Polymerization initiator | |
| IRGACURE OXE-02 (manufactured by BASF SE) | 0.200 parts by mass |
| Interface improver F-2 below | 0.052 parts by mass |
| Cyclopentanone | 47.50 parts by mass |
| Tetrahydrofuran | 47.50 parts by mass |

Interface Improver F-2

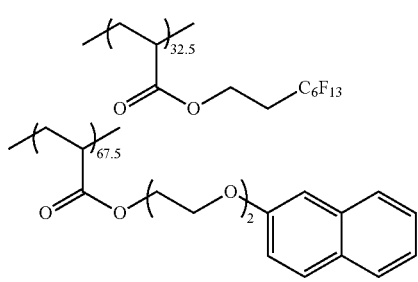

Example 9

The obtained alignment film PA1 was coated with a composition L-1 for a liquid crystal layer, having the following composition, using a wire bar to form a coating layer L-1.

Next, the coating layer L-1 was dried at room temperature to form the first coating film L-1 on the alignment film PAL The film thickness of the first coating film L-1 was 50 nm.

| Composition of composition L-1 for forming liquid crystal layer | |
|---|---|
| High-molecular weight liquid crystal compound P-1 above | 2.19 parts by mass |
| Low-molecular weight liquid crystal compound L-2 above | 0.24 parts by mass |
| Polymerization initiator | |
| IRGACURE OXE-02 (manufactured by BASF SE) | 0.200 parts by mass |
| Interface improver F-2 above | 0.14 parts by mass |
| Methyl ethyl ketone | 371 parts by mass |

The obtained first coating film L-1 was continuously coated with the liquid crystal composition P3 described above was with a wire bar to form a second coating film P9.

Next, the second coating film P9 was heated at 140° C. for 90 seconds, and the second coating film P9 was cooled to 23° C. of room temperature.

Next, the coating film was heated at 80° C. for 60 seconds and cooled again to room temperature.

Then, a light absorption anisotropic film P9 including the first coating film L-1 was prepared on the alignment film PA1 by irradiating with an LED lamp (center wavelength: 365 nm) for 2 seconds under an irradiation condition of an illuminance of 200 mW/cm².

The film thickness of the light absorption anisotropic film P9 was 0.45 μm.

An oxygen barrier layer B1 was formed on the obtained light absorption anisotropic layer P9 in the same manner as in Example 1 to prepare a laminated film 9.

Comparative Example 1

As Comparative Example 1, Example 21 of WO2018/199096A was retested.

Here, in Comparative Example 1, the structures of the high-molecular weight liquid crystal compound, the dichroic substance, the low-molecular weight liquid crystal compound, and the interface improver, which are contained in the liquid crystal composition that is used for forming the light absorption anisotropic film, are as follows.

High-Molecular Weight Liquid Crystal Compound P-3

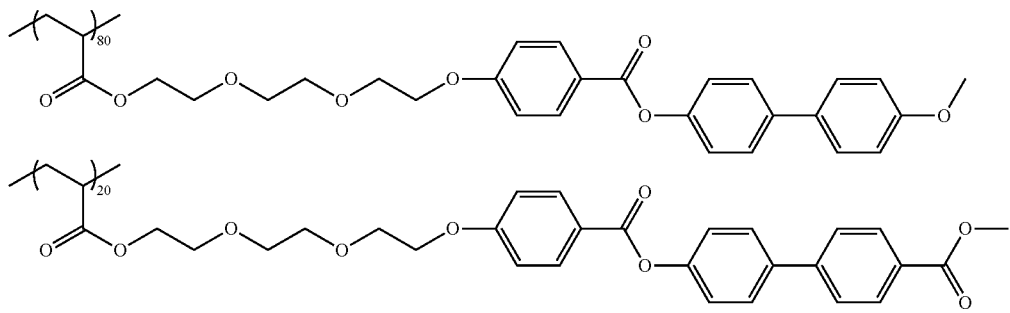

Dichroic Substance D-1

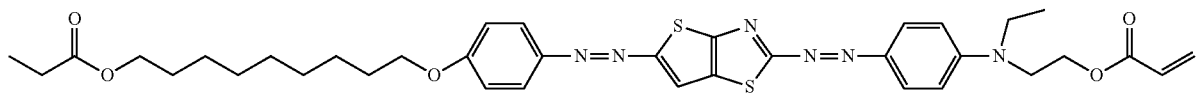 [SMILES: C=CC(=O)OCCN(CC)c1ccc(N=Nc2nc3sc(N=Nc4ccc(OCCCCCCCCCOC(=O)CC)cc4)cc3s2)cc1]

Low-Molecular Weight Liquid Crystal Compound L-1

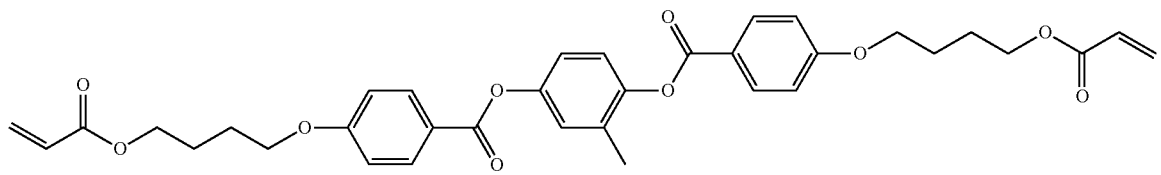 [SMILES: C=CC(=O)OCCCCOc1ccc(C(=O)Oc2ccc(OC(=O)c3ccc(OCCCCOC(=O)C=C)cc3)c(C)c2)cc1]

Surfactant F-3

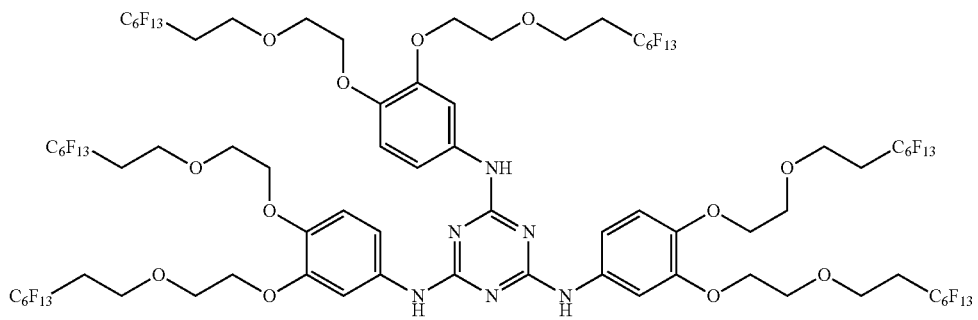

Example 10

A laminated film was prepared in the same manner as in Comparative Example 1 except that 80° C. of the heating temperature after cooling the coating film to room temperature was changed to 90° C. at the time of preparation of the light absorption anisotropic film.

[Evaluation]

<Dichroic Substance-Derived Intensity Ratio>

For each of the prepared laminated film s, the maximum intensity Imax of the light absorption anisotropic film in the thickness direction and the intensity Isur on a surface (an interface) of the light absorption anisotropic film, on a side where an alignment film is provided, were measured according to the measurement method of TOF-SIMS described above to calculate, and the intensity ratio (Imax/Isur) was calculated. The evaluation results are shown in Table 1 below.

<Evaluation of Alignment Degree>

In a state in which a linear polarizer was inserted on the light source side of an optical microscope (manufactured by Nikon Corporation, product name "ECLIPSE E600 POL"), the laminate of each of Examples and Comparative Examples was set on a sample table, and using a multi-channel spectroscope (manufactured by Ocean Optics, Inc., product name "QE65000"), an absorbance of the laminate in a wavelength range of 400 nm to 700 nm was measured to calculate an alignment degree by the following expression. The evaluation results are shown in Table 1 below.

Alignment degree:$S=[(Az0/Ay0)-1]/[(Az0/Ay0)+2]$

Az0: Absorbance of laminate with respect to polarization in absorption axis direction.
Ay0: Absorbance of laminate with respect to polarization in polarization axis direction.

<Evaluation of Adhesiveness>

The obtained laminated film was cut into a size of 25 mm×150 mm, an adhesive tape consisting of a laminate of a pressure-sensitive adhesive SK2057 (manufactured by Soken Chemical & Engineering Co., Ltd.) and TJ40UL was attached to the surface of the oxygen barrier layer of the laminated film while applying a load of 1 kg, and then peeled off.

The peeled surface was observed and evaluated according to the following criteria. The evaluation results are shown in Table 1 below.
A: No peeling is observed.
B: Peeling is observed but is 5% or less in terms of the area.
C: Peeling is observed and is more than 5% and 10% or less in terms of the area.
D: Peeling is observed and is more than 10% in terms of the area.

polymerizable group, and a dichroic substance comprising a non-crosslinkable and non-polymerizable component,
wherein regarding a signal derived from the dichroic substance detected by a time-of-flight secondary ion mass spectrometry, a relationship between a maximum intensity Imax in a thickness direction of the film and an intensity Isur on at least one surface of the film satisfies Expression (I-1), $$2 \leq I\mathrm{max}/I\mathrm{sur} \qquad (I\text{-}1),$$

wherein the maximum intensity Imax and the intensity Isur respectively refer to intensities defined below,
Imax: where the light absorption anisotropic film, which is a measurement target, is subjected to a mass spectrometric analysis measurement in a region to 80% of a total thickness, excluding a portion from each surface of the light absorption anisotropic film to 10% of the total thickness, a maximum value of intensities of fragments derived from the dichroic substance is defined as the maximum intensity Imax;
Isur: where the light absorption anisotropic film, which is the measurement target, is subjected to a mass spectrometric analysis measurement in a portion from each surface of the light absorption anisotropic film to 10% of the total thickness, among average values of the

TABLE 1

| | Light absorption anisotropic film | | | | | | | |
|---|---|---|---|---|---|---|---|---|
| | High-molecular weight liquid crystal compound | Dichroic substance | Low-molecular weight liquid crystal compound | Interface improver | Dichroic substance-derived intensity ratio Imax/Isur | Adhesiveness | Alignment Degree | Note |
| Example 1 | P-1 | Y-1, M-1, C-1 | — | F-1 | 2.4 | C | 0.96 | |
| Example 2 | P-1 | Y-1, M-1, C-1 | L-1 | F-1 | 5.8 | B | 0.98 | |
| Example 3 | P-1 | Y-1, M-1, C-1 | L-2 | F-1 | 28.0 | A | 0.98 | |
| Example 4 | P-2 | Y-1, M-1, C-1 | L-2 | F-1 | 19.0 | A | 0.98 | |
| Example 5 | P-2 | Y-1, M-1, C-2 | L-2 | F-1 | 25.6 | A | 0.98 | |
| Example 6 | P-2 | Y-1, M-1, C-2 | L-3 | F-1 | Isur was below the measurement limit. | A | 0.98 | |
| Example 7 | P-3 | Y-1, M-1, C-1 | L-2 | F-1 | 18.0 | B | 0.98 | |
| Example 8 | P-1 | Y-1, M-1, C-1 | — | F-2 | 24.0 | A | 0.94 | |
| Example 9 | P-1 | Y-1, M-1, C-1 | L-2 | F-1 | Isur was below the measurement limit. | A | 0.95 | |
| Example 10 | P-3 | D-1 | L-1 | F-3 | 8.5 | B | 0.96 | Temperature was changed from Example 21 of WO2018/199096A |
| Comparative Example 1 | P-3 | D-1 | L-1 | F-3 | 1.2 | D | 0.97 | Example 21 of WO2018/199096A |

It has been found that regarding the signal derived from the dichroic substance detected by TOF-SIMS, in a case where a relationship between a maximum intensity Imax of the light absorption anisotropic film in a thickness direction and an intensity Isur on a surface of the light absorption anisotropic film, on a side where an alignment film is provided, does not satisfy Expression (I-1), the adhesiveness is inferior (Comparative Example 1).

On the other hand, it has been found that in a case where the relationship between the maximum intensity Imax and the intensity Isur satisfies Expression (I-1), the adhesiveness was improved in all the cases (Examples 1 to 10).

What is claimed is:

1. A light absorption anisotropic film formed from a cured film of a liquid crystal composition that contains a high-molecular weight liquid crystal compound comprising a intensities of fragments derived from the dichroic substance, a lower value is defined as the intensity Isur.

2. The light absorption anisotropic film according to claim 1,
wherein the relationship between the maximum intensity Imax and the intensity Isur satisfies Expression (I-2), $$5 \leq I\mathrm{max}/I\mathrm{sur} \qquad (I\text{-}2).$$

3. The light absorption anisotropic film according to claim 1,
wherein the liquid crystal composition further contains a low-molecular weight liquid crystal compound.

4. The light absorption anisotropic film according to claim 3,
wherein the low-molecular weight liquid crystal compound has a polymerizable group.

5. The light absorption anisotropic film according to claim 1,
wherein the liquid crystal composition further contains an interface improver.

6. A laminate comprising, in the following order:
a base material;
an alignment film; and
a light absorption anisotropic film,
wherein the light absorption anisotropic film is the light absorption anisotropic film according to claim 1, and
regarding a signal derived from the dichroic substance detected by a time-of-flight secondary ion mass spectrometry, a relationship between a maximum intensity Imax of the light absorption anisotropic film in a thickness direction and an intensity Isur on a surface of the light absorption anisotropic film, on a side where the alignment film is provided, satisfies Expression (I-1), $$2 \leq I\text{max}/I\text{sur} \qquad (\text{I-1}),$$

wherein the maximum intensity Imax and the intensity Isur respectively refer to intensities defined below,
Imax: where the light absorption anisotropic film, which is a measurement target, is subjected to a mass spectrometric analysis measurement in a region to 80% of a total thickness, excluding a portion from each surface of the light absorption anisotropic film to 10% of the total thickness, a maximum value of intensities of fragments derived from the dichroic substance is defined as the maximum intensity Imax;
Isur: where the light absorption anisotropic film, which is the measurement target, is subjected to a mass spectrometric analysis measurement in a portion from each surface of the light absorption anisotropic film to 10% of the total thickness, among average values of the intensities of fragments derived from the dichroic substance, a lower value is defined as the intensity Isur.

7. The laminate according to claim 6, further comprising a λ/4 plate which is provided on the light absorption anisotropic film.

8. An image display device comprising: the laminate according to claim 7.

9. An image display device comprising:
the laminate according to claim 6.

10. An image display device comprising:
the light absorption anisotropic film according to claim 1.

11. The light absorption anisotropic film according to claim 2,
wherein the liquid crystal composition further contains a low-molecular weight liquid crystal compound.

12. The light absorption anisotropic film according to claim 11,
wherein the low-molecular weight liquid crystal compound has a polymerizable group.

13. The light absorption anisotropic film according to claim 2,
wherein the liquid crystal composition further contains an interface improver.

14. A laminate comprising, in the following order:
a base material;
an alignment film; and
a light absorption anisotropic film,
wherein the light absorption anisotropic film is the light absorption anisotropic film according to claim 2, and
regarding a signal derived from the dichroic substance detected by a time-of-flight secondary ion mass spectrometry, a relationship between a maximum intensity Imax of the light absorption anisotropic film in a thickness direction and an intensity Isur on a surface of the light absorption anisotropic film, on a side where the alignment film is provided, satisfies Expression (I-2), $$5 \leq I\text{max}/I\text{sur} \qquad (\text{I-2}),$$

wherein the maximum intensity Imax and the intensity Isur respectively refer to intensities defined below,
Imax: where the light absorption anisotropic film, which is a measurement target, is subjected to a mass spectrometric analysis measurement in a region to 80% of a total thickness, excluding a portion from each surface of the light absorption anisotropic film to 10% of the total thickness, a maximum value of intensities of fragments derived from the dichroic substance is defined as the maximum intensity Imax;
Isur: where the light absorption anisotropic film, which is the measurement target, is subjected to a mass spectrometric analysis measurement in a portion from each surface of the light absorption anisotropic film to 10% of the total thickness, among average values of the intensities of fragments derived from the dichroic substance, a lower value is defined as the intensity Isur.

15. The laminate according to claim 14, further comprising a λ/4 plate which is provided on the light absorption anisotropic film.

16. An image display device comprising: the laminate according to claim 15.

17. An image display device comprising: the laminate according to claim 14.

18. An image display device comprising:
the light absorption anisotropic film according to claim 2.

19. An image display device comprising: the laminate according to claim 14,
wherein the liquid crystal composition from which the light absorption anisotropic film is formed, further contains a low-molecular weight liquid crystal compound that has a polymerizable group, and an interface improver.

* * * * *